US011251108B2

(12) United States Patent
Arai

(10) Patent No.: US 11,251,108 B2
(45) Date of Patent: Feb. 15, 2022

(54) SEMICONDUCTOR MODULE MOUNTED ON A COOLING DEVICE FOR USE IN A VEHICLE

(71) Applicant: FUJI ELECTRIC CO., LTD., Kanagawa (JP)

(72) Inventor: Nobuhide Arai, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 53 days.

(21) Appl. No.: 16/589,097

(22) Filed: Sep. 30, 2019

(65) Prior Publication Data
US 2020/0144157 A1    May 7, 2020

(30) Foreign Application Priority Data
Nov. 6, 2018    (JP) .............................. JP2018-208541

(51) Int. Cl.
| | |
|---|---|
| *H01L 23/473* | (2006.01) |
| *H01L 25/07* | (2006.01) |
| *B60R 16/023* | (2006.01) |
| *H02K 11/33* | (2016.01) |

(Continued)

(52) U.S. Cl.
CPC ........ *H01L 23/473* (2013.01); *B60R 16/0231* (2013.01); *H01L 23/50* (2013.01); *H01L 25/072* (2013.01); *H02K 7/006* (2013.01); *H02K 11/33* (2016.01)

(58) Field of Classification Search
CPC ..... H01L 23/473; H01L 25/072; H01L 23/50; H01L 24/50; H01L 24/84; H01L 2224/40; H01L 2224/841214; H01L 2224/84214; H01L 23/5386; H01L 2224/40225; H01L 2224/84801; H01L 25/07; B60R 16/0231;
(Continued)

(56) References Cited

U.S. PATENT DOCUMENTS 8,917,509 B2 * 12/2014 Tokuyama ............ H01L 23/492
                                                361/699
10,506,744 B2 * 12/2019 Kosuga ................. H02M 5/257
10,797,036 B2 * 10/2020 Nagase ................. H02M 7/003
(Continued)

FOREIGN PATENT DOCUMENTS

| JP | 2010103222 A | 5/2010 |
| JP | 2011160519 A | 8/2011 |

(Continued)

*Primary Examiner* — Alexander O Williams

(57) ABSTRACT

A semiconductor module includes a semiconductor device, and a cooling device. The semiconductor device has: an input terminal; a wiring portion that includes a first end portion, and a second end portion, and extends in one direction, the first end portion being connected to the input terminal; a circuit substrate that includes a top surface, and a bottom surface, the top surface being provided with a first circuit board and a second circuit board along the one direction, the bottom surface being arranged on a top surface of the cooling device; a metal body connected between the wiring portion, and a top surface of the first circuit board; and a semiconductor chip that includes a top surface electrode, and a bottom surface electrode, the top surface electrode being connected to the second end portion, the bottom surface electrode being connected to a top surface of the second circuit board.

13 Claims, 13 Drawing Sheets

(51) Int. Cl.
  *H02K 7/00*  (2006.01)
  *H01L 23/50*  (2006.01)
(58) Field of Classification Search
  CPC ...... B60R 16/023; H02K 11/33; H02K 7/006;
    H02K 7/00
  USPC .......................................................... 257/691
  See application file for complete search history.

(56) References Cited

U.S. PATENT DOCUMENTS

| | | | | |
|---|---|---|---|---|
| 10,903,128 B2* | 1/2021 | Shafiyan-Rad | ......... | H01L 23/10 |
| 2007/0084585 A1* | 4/2007 | Takagi | ...................... | F28F 3/12 |
| | | | | 165/80.4 |
| 2007/0240867 A1* | 10/2007 | Amano | ................ | H01L 23/473 |
| | | | | 165/168 |
| 2008/0291710 A1* | 11/2008 | Aoki | ..................... | H01L 23/473 |
| | | | | 363/131 |
| 2011/0188204 A1* | 8/2011 | Horiuchi | .............. | H01L 23/473 |
| | | | | 361/702 |
| 2011/0188279 A1 | 8/2011 | Aiba | | |
| 2013/0206371 A1* | 8/2013 | Fujita | .................... | H01L 23/473 |
| | | | | 165/104.28 |
| 2014/0043765 A1* | 2/2014 | Gohara | ............. | H05K 7/20927 |
| | | | | 361/699 |
| 2016/0035646 A1 | 2/2016 | Soyano | | |
| 2016/0294379 A1* | 10/2016 | Hayash | .................. | H01L 24/40 |
| 2017/0006721 A1 | 1/2017 | Soyano | | |
| 2017/0288512 A1* | 10/2017 | Kagawa | ............... | B60H 1/3222 |
| 2018/0145007 A1* | 5/2018 | Hatano | .................. | H01L 24/48 |
| 2019/0198420 A1* | 6/2019 | Schmit | .................... | H01L 23/50 |
| 2019/0304874 A1* | 10/2019 | Arai | .................. | H05K 7/20854 |

FOREIGN PATENT DOCUMENTS

| | | |
|---|---|---|
| JP | 2014067902 A | 4/2014 |
| JP | 2017017195 A | 1/2017 |
| JP | 2017069581 A | 4/2017 |
| JP | 2018070713 A | 5/2018 |
| JP | 2019186238 A | 10/2019 |
| WO | 2016204257 A1 | 12/2016 |

* cited by examiner

SEMICONDUCTOR MODULE MOUNTED ON A COOLING DEVICE FOR USE IN A VEHICLE

BACKGROUND

1. Technical Field

The present invention relates to a semiconductor module, and a vehicle.

2. Related Art

There are conventional, known semiconductor modules including a semiconductor element such as a power semiconductor chip (see Patent Literatures 1 to 5, for example).

Patent Literature 1: Japanese Patent Application Publication No. 2014-67902

Patent Literature 2: Japanese Patent Application Publication No. 2010-103222

Patent Literature 3: Japanese Patent Application Publication No. 2017-17195

Patent Literature 4: Japanese Patent Application Publication No. 2011-160519

Patent Literature 5: WO2016/204257

The total cooling efficiency was low since a capacitor generates heat if an input terminal of a semiconductor module is connected with the capacitor.

SUMMARY

In order to overcome drawbacks explained above, a first aspect of the present invention provides a semiconductor module including a semiconductor device, and a cooling device. The semiconductor device may have an input terminal. The semiconductor device may have a wiring portion that includes a first end portion, and a second end portion, and extends in one direction, the first end portion being connected to the input terminal. The semiconductor device may have a circuit substrate that includes a top surface, and a bottom surface, the top surface being provided with a first circuit board and a second circuit board along the one direction, the bottom surface being arranged on a top surface of the cooling device. The semiconductor device may have a metal body connected between the wiring portion, and a top surface of the first circuit board. The semiconductor device may have a semiconductor chip that includes a top surface electrode, and a bottom surface electrode, the top surface electrode being connected to the second end portion, the bottom surface electrode being connected to a top surface of the second circuit board.

The metal body may be connected to a portion of the wiring portion, the portion being closer to the input terminal than the semiconductor chip is.

The first circuit board may have an area larger than an area of contact with the metal body when seen in a plan view.

The input terminal may be an N terminal. The circuit substrate may further be provided with a third circuit board. The semiconductor device may have a P terminal. The semiconductor device may have a second wiring portion that includes a third end portion, and a fourth end portion, and extends in the one direction, the third end portion being connected to the P terminal. The semiconductor device may have a second metal body connected between the second wiring portion and a top surface of the third circuit board. The semiconductor device may have a second semiconductor chip that includes a top surface electrode, and a bottom surface electrode, the bottom surface electrode being connected to the top surface of the third circuit board.

The second circuit board, and the third circuit board may each have an L-shaped pattern including a longer portion and a shorter portion when seen in a plan view. The longer portions may each extend in the one direction. The longer portion of the second circuit board, and the shorter portion of the third circuit board may face each other, and be arranged with a gap therebetween, the gap extending in the one direction, and the shorter portion of the second circuit board, and the longer portion of the third circuit board may face each other, and be arranged with a gap therebetween, the gap extending in the one direction. The semiconductor chip, and the second semiconductor chip may be connected to the shorter portion of the second circuit board, and the shorter portion of the third circuit board, respectively, and overlap with each other only partially when seen in the one direction.

The second metal body may be positioned on the longer portion of the third circuit board, and be positioned closer to the P terminal than the second semiconductor chip is.

When seen in the plan view, the second circuit board may have an area larger than an area of contact with the semiconductor chip. The third circuit board may have an area larger than an area of contact with the second semiconductor chip and the second metal body.

The metal body and the second metal body may each be substantially a rectangular parallelepiped. A bottom surface area of the metal body may be smaller than a bottom surface area of the second metal body.

A longer side of a bottom surface of the metal body may be shorter than a longer side of a bottom surface of the second metal body. The longer side of the bottom surface of the metal body may be orthogonal to the one direction, and the longer side of the bottom surface of the second metal body may be parallel to the one direction.

The cooling device may have a top plate including a front surface, and a back surface. The cooling device may have a refrigerant circulation portion arranged on the back surface of the top plate. The cooling device may have a cooling fin provided to extend from the back surface toward the refrigerant circulation portion. The cooling device may have an inlet that is for letting in a refrigerant, and communicates with the refrigerant circulation portion. The cooling device may have an outlet that is for letting out a refrigerant, and communicates with the refrigerant circulation portion. When seen in a plan view, the metal body may be arranged at a position corresponding to a finned area where the cooling fin is provided.

The cooling device may have a top plate including a front surface, and a back surface. The cooling device may have a refrigerant circulation portion arranged on the back surface of the top plate. The cooling device may have a cooling fin provided to extend from the back surface toward the refrigerant circulation portion. The cooling device may have an inlet that is for letting in a refrigerant, and communicates with the refrigerant circulation portion. The cooling device may have an outlet that is for letting out a refrigerant, and communicates with the refrigerant circulation portion. When seen in a plan view, the metal body and the second metal body may be arranged at a position corresponding to a finned area where the cooling fin is provided.

When seen in the plan view, the circuit substrate may have a first end closer to the input terminal, and a second end opposite to the first end. When seen in the plan view, the finned area may have a first boundary closer to the input terminal, and a second boundary opposite to the first boundary. When seen in the plan view, a distance between the first end and the first boundary may be longer than a distance between the second end and the second boundary.

A second aspect of the present invention provides a vehicle including the semiconductor module according to the first aspect.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
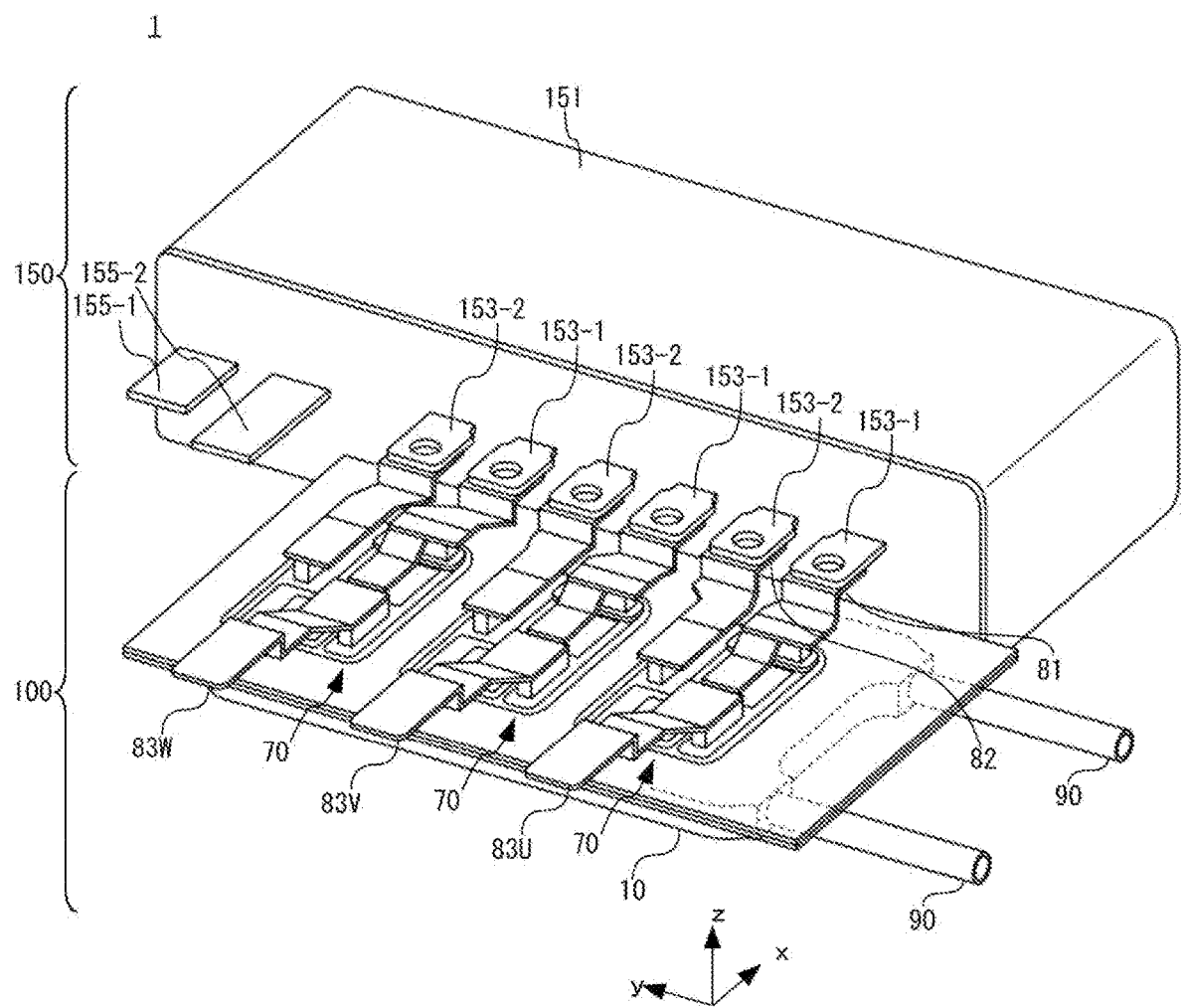
FIG. 1 is a schematic perspective view illustrating an exemplary inverter 1 according to a first embodiment of the present invention.

FIG. 1 is a schematic perspective view illustrating an exemplary inverter 1 according to a first embodiment of the present invention. The inverter 1 may include a semiconductor module 100 and a capacitor device 150. The semiconductor module 100 includes semiconductor devices 70, and a cooling device 10. The semiconductor module 100 in the present example includes the semiconductor devices 70 having three pairs of input terminals (P terminals 82, and N terminals 81), and output terminals 83U, 83V, 83W, and functions as a device constituting a three-phase AC inverter. The semiconductor devices 70 in the present example are placed on the cooling device 10. In the present specification, a surface of the cooling device 10 on which the semiconductor devices 70 are placed is treated as the x-y plane, and the plane perpendicular to the x-y plane is treated as the z axis. The x, y and z axes form a right-handed system. Although the direction from the cooling device 10 to the semiconductor devices 70 in the z-axis direction is referred to as the upward direction, and the opposite direction is referred to as the downward direction in the present specification, the upward, and downward directions are not limited to those relative to the direction of gravity. In addition, among surfaces of each member, the upper surface is referred to as the top surface, the lower surface is referred to as the bottom surface, and surfaces between the top surface and the bottom surface are referred to as side surfaces in the present specification. The plan view means a view of the semiconductor module 100 as seen in the z-axis positive direction in the present specification.

The semiconductor module 100 may be connected to the external capacitor device 150. The capacitor device 150 includes three pairs of terminals (153-1, 153-2), an internal capacitor, and power supply terminals 155. The N terminals 81 and P terminals 82 of the semiconductor module 100 are connected to the internal capacitor of the capacitor device 150 electrically in parallel via the terminals 153. Note that the output terminals 83U, 83V, 83W in the semiconductor devices 70 may be electrically connected to a load, for example a motor of a vehicle or the like.

The cooling device 10 of the semiconductor module 100 can be connected to an external refrigerant supply source by two pipes 90. A refrigerant is carried into the cooling device 10 through one of the pipes 90, and the refrigerant is carried out from the cooling device 10 through the other pipe 90 after circulating inside the cooling device 10.

The capacitor device 150 has: a housing 151 that houses circuit elements such as the internal capacitor; the three pairs of terminals 153-1, 153-2 each protruding out of the housing 151; a negative power-supply terminal 155-1 electrically connected to the negative electrode of an external power supply; and a positive power-supply terminal 155-2 electrically connected to the positive electrode of the external power supply. The terminals 153-1, 153-2, and the power supply terminals 155-1, 155-2 are electrically connected to each other at the capacitor device 150, respectively. The negative power-supply terminal 155-1, and positive power-supply terminal 155-2 may be connected to electrodes of an external power supply such as a battery, for example.

The three terminals 153-1 may be electrically connected to the three N terminals 81 of the semiconductor module 100, respectively. In addition, the three terminals 153-2 may be electrically connected to the P terminals 82 of the semiconductor module 100, respectively.

At the inverter 1, the internal capacitor of the capacitor device 150 generates heat due to operation of the inverter 1, and the heat generated by the capacitor is transmitted to the semiconductor module 100. The semiconductor module 100 of the inverter 1 in the present embodiment can dissipate the heat of the capacitor to the cooling device 10 by way of the semiconductor devices 70 to thereby cool the entire inverter 1.

Figure 2:
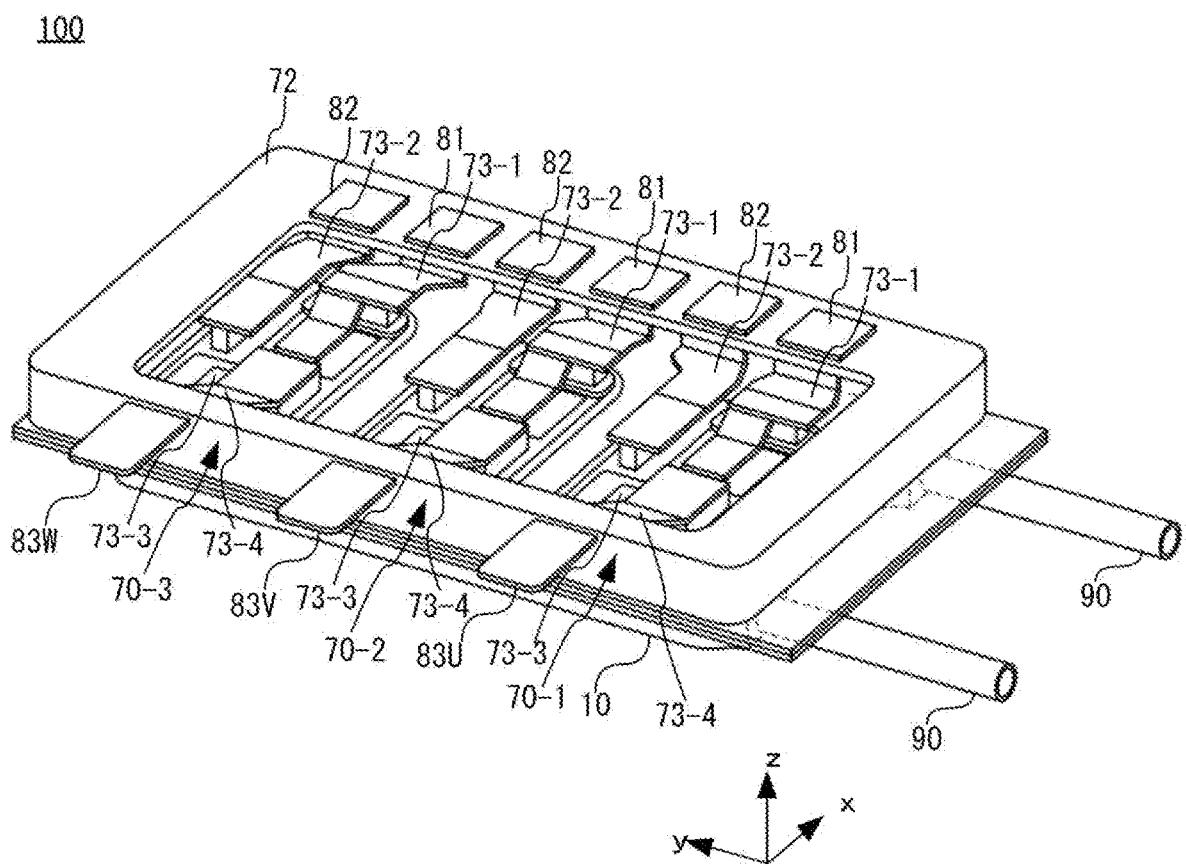
FIG. 2 is a schematic perspective view illustrating an exemplary semiconductor module 100 according to the first embodiment of the present invention.
Figure 3:
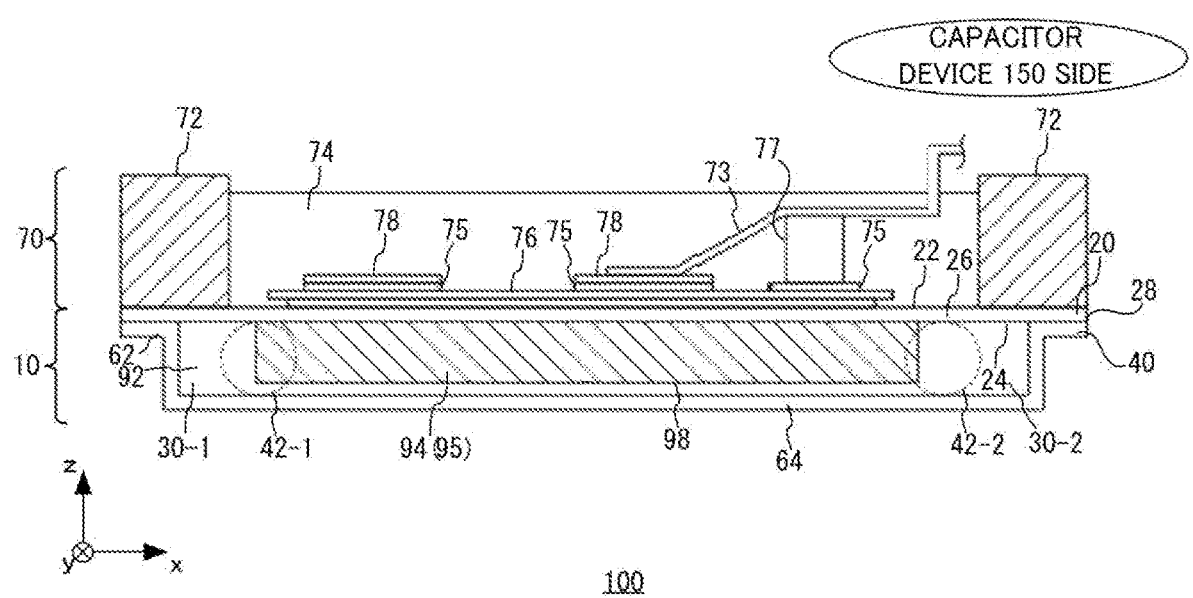
FIG. 3 is a schematic cross-sectional view illustrating the exemplary semiconductor module 100 according to the first embodiment of the present invention.

FIG. 2 and FIG. 3 are a schematic perspective view, and cross-sectional view illustrating an exemplary semiconductor module 100 according to the first embodiment of the present invention. The inverter 1 explained by using FIG. 1 may be one example of usage of the semiconductor module 100 illustrated in FIG. 2 and FIG. 3.

As illustrated in the figures, the semiconductor module 100 includes semiconductor devices 70 (70-1, 70-2, 70-3), and the cooling device 10. The semiconductor devices 70 are placed on the top surface of the cooling device 10. The semiconductor devices 70 have input terminals (N terminals 81, P terminals 82), output terminals (83U, 83V, 83W), lead frames (wiring portions) 73 (73-1, 73-2, 73-3, 73-4), circuit substrates 76, metal bodies 77, and semiconductor chips 78.

The semiconductor devices 70 may include three circuit substrates 76. The circuit substrates 76 may be provided with circuit boards 75. Two semiconductor chips 78 may be mounted on the circuit boards 75. The circuit substrates 76, semiconductor chips 78, lead frames 73, and metal bodies 77 may be housed in a housing unit 72. The input terminals (N terminals 81, P terminals 82), and output terminals (83U, 83V, 83W) may be provided integrally in the housing unit 72.

The input terminals (N terminals 81, P terminals 82) may be electrically connected to the terminals 153-1 and terminals 153-2 of the capacitor device 150, respectively, to be thereby electrically connected to the internal capacitor of the capacitor device 150, and the negative electrode and positive electrode of the external power supply. The output terminals 83U, 83V, 83W may each be electrically connected to an external motor, for example.

The lead frames 73 are plate-like wires formed of a conductive material such as copper, a copper alloy, or aluminum. The lead frames 73 may have plated surfaces. A lead frame 73-1 and a lead frame 73-2 each have one end portion (a first end portion, and a third end portion), and the other end portion (a second end portion, and a fourth end portion), and extend in one direction, and the one end portion is connected to input terminals (an N terminal 81, a P terminal 82). The lead frames 73 may be bonded to individual ones of the top surfaces of the semiconductor chips 78, metal bodies 77, circuit boards 75, N terminals 81, P terminals 82 and output terminals 83U, 83V, 83W by a bonding material such as solder, or by welding such as laser welding, TIG welding, or resistance welding. Thereby, the lead frames 73 establish connections between individual circuit elements on the circuit substrates 76, and also establish connections between individual circuit elements on the circuit substrates 76, and individual ones of the N terminals 81, P terminals 82, and output terminals 83U, 83V, 83W.

For example, the circuit substrates 76 are laminate substrates including, in order: insulating boards having top surfaces and bottom surfaces; circuit layers provided on the top surfaces of the insulating boards, and metal layers provided at the bottom surfaces. The circuit substrates 76 have top surfaces, and bottom surfaces, the bottom surfaces being arranged on the top surface of the cooling device 10. As illustrated in FIG. 3, the circuit substrates 76 may be arranged on the top surface of the cooling device 10 such that they are shifted away from the capacitor device 150. For example, the circuit substrates 76 are fixed to the top surface of the cooling device 10 via a metal layer by solder or the like. In addition, on the top surface side of the circuit substrates 76, the circuit boards 75 (first circuit boards, second circuit boards, third circuit board) which are exemplary circuit layers are provided along one direction in which the lead frames 73-1, and lead frames 73-2 extend, and the two semiconductor chips 78 are fixed via the circuit boards 75. The circuit layers may include a plurality of circuit boards 75.

The circuit substrates 76 may be DCB (Direct Copper Bonding) substrates or AMB (Active Metal Brazing) substrates, for example). The insulating boards may be formed by using a ceramic material such as alumina ($Al_2O_3$), aluminum nitride (AlN), or silicon nitride ($Si_3N_4$). The circuit layers, and metal layers may be plate-like materials containing a metal such as copper or a copper alloy.

The circuit boards 75 are formed of a conductive material such as copper. The circuit boards 75 are fixed on the top surface side of the circuit substrates 76 by solder, brazing filler materials or the like. The individual semiconductor chips 78, and metal bodies 77 are electrically and mechanically connected to, that is, connected directly electrical-circuit-wise to, the top surfaces of the circuit boards 75 by solder or the like. Note that the circuit boards 75 may be electrically connected with other electrically conductive members by wires or the like.

The metal bodies 77 are block-like members formed of a metal having thermal conductivity higher than that of resin, for example, at least any one of metals such as copper, silver, gold, or aluminum, and preferably copper or a copper alloy. The metal bodies 77 may be substantially rectangular parallelepipeds. The metal bodies 77 each have one end that is connected to a lead frame 73, and the other end connected to the top surface of a circuit substrate 76 via a circuit board 75. In other words, the metal bodies 77 are connected between the lead frames 73-1 and lead frames 73-2, and the top surfaces of the circuit boards 75. For example, the metal bodies 77 are fixed to the top surfaces of the circuit boards 75 by solder or the like. Heat generated in the capacitor device 150 can be transferred to the cooling device 10 via the terminals 153-1, N terminals 81, lead frames 73-1, metal bodies 77-1, and circuit substrates 76. In addition, heat generated in the capacitor device 150 can also be transferred to the cooling device 10 via the terminals 153-2, P terminals 82, lead frames 73-2, metal bodies 77-3, and circuit substrates 76. In addition, heat generated in the semiconductor chips 78 can also be transferred to the cooling device 10 via paths including the lead frames 73, metal bodies 77, and circuit substrates 76.

The two semiconductor chips 78 are vertical semiconductor elements, and have top surface electrodes, and bottom surface electrodes. For example, the semiconductor chips 78 each include an element such as an insulated-gate bipolar transistor (IGBT), a MOS field-effect transistor (MOSFET), or a free-wheel diode (FWD) that is formed on a semiconductor substrate made of silicon or the like. Each semiconductor chip 78 may be a reverse conducting IGBT (RC-IGBT) having an IGBT and a FWD that are formed on one semiconductor substrate. In the RC-IGBT, the IGBT, and FWD may be connected in anti-parallel.

Each semiconductor chip 78 (a semiconductor chip, and a second semiconductor chip) has a top surface electrode, and a bottom surface electrode, the bottom surface electrode being connected to the top surface of a circuit board 75 (a second circuit board, and a third circuit board). The top surface electrode of one of the semiconductor chips 78 (the semiconductor chip) is connected to the other end portion (the second end portion) of a lead frame 73-1. The top surface electrode of the other semiconductor chip 78 (the second semiconductor chip) is connected to the output terminal via a lead frame 73-3, and a lead frame 73-4. The top surface electrode of each semiconductor chip 78 may be an emitter, source or anode electrode, and the bottom surface electrode may be a collector or cathode electrode. The semiconductor substrate in each semiconductor chip 78 may be silicon carbide or gallium nitride.

A semiconductor chip 78 including a switch element such as an IGBT or a MOSFET has a control electrode. The semiconductor module 100 may have a control terminal connected to the control electrode of the semiconductor chip 78. The switch element can be controlled by an external control circuit via the control terminal.

The housing unit 72 is a frame body formed of an insulating material such as a thermosetting resin or a ultra-violet ray curing resin, for example, and houses individual constituents of the semiconductor devices 70. The housing unit 72 has an internal space that houses the semiconductor chips 78, circuit substrates 76, circuit boards 75, lead frames 73, metal bodies 77, and other circuit elements. The internal space of the housing unit 72 may be filled with a sealing portion 74 that seals in the semiconductor chips 78, circuit substrates 76, circuit boards 75, lead frames 73, metal bodies 77, and other circuit elements. The sealing portion 74 is an insulating member including a resin such as silicone gel or an epoxy resin, for example. Note that illustrations of the housing unit 72 and sealing portion 74 are omitted in FIG. 1 for simplification of explanations.

The cooling device 10 has a top plate 20, and a jacket 40. The top plate 20 may be a plate-like metallic plate having a top surface (front surface) 22, and a bottom surface (back surface) 24 that are parallel to the x-y plane. The top plate 20 may have two opposite shorter sides 26, and two opposite longer sides 28. The shorter sides 26 may be parallel to the x-axis direction, and the longer sides may be parallel to the y-axis direction. For example, the top plate 20 is formed of a metal including aluminum. The semiconductor devices 70 are placed on the top surface 22 of the top plate 20. The top plate 20 receives heat that is generated at and transferred from the individual semiconductor chips 78, and capacitor device 150. The top plate 20, circuit substrates 76, and semiconductor chips 78 are arranged in this order. Thermal connections may be established between the top plate 20 and the circuit substrates 76, and between the circuit substrates 76 and the semiconductor chips 78 by a member such as solder. A thermal connection between the top plate 20 and the internal capacitor may be established by members such as the terminals 153, N terminals 81, P terminals 82, lead frames 73, and metal bodies 77. The circuit substrates 76 may be directly fixed to the top surface 22 of the top plate 20 by solder or the like. The housing unit 72 may be provided to surround an area of the top surface 22 of the top plate 20 where the circuit substrates 76 or the like are arranged. The housing unit 72 may be caused to adhere onto the top surface 22 of the top plate 20. In another example, the semiconductor devices 70 may have base boards that are exposed through the bottom surface of the housing unit 72, the circuit substrates 76 may be fixed to the top surfaces of the base boards, and the base boards may be fixed to the top surface 22 of the top plate 20.

The jacket 40 has a frame portion 62, and a main-body portion 64. The frame portion 62 is arranged to surround the main-body portion 64, and a refrigerant circulation portion 92 on the x-y plane. The refrigerant circulation portion 92 is delimited by the inner surface of the main-body portion 64, and the bottom surface of the top plate 20. The refrigerant circulation portion 92 is arranged on a bottom surface 24 side of the top plate 20. The refrigerant circulation portion 92 is an area where a refrigerant such as an LLC or water let into the cooling device 10 circulates. The refrigerant contacts the bottom surface 24 of the top plate 20 on which the circuit substrates 76 are arranged to thereby be able to cool the semiconductor devices 70. The refrigerant circulation portion 92 may be a tightly closed space contacting the bottom surface 24 of the top plate 20. The jacket 40 is arranged in the frame portion 62 so as to be caused to closely adhere directly or indirectly to the bottom surface 24 of the top plate 20. Thereby, the refrigerant circulation portion 92 is tightly closed. Note that to closely adhere indirectly means that the bottom surface 24 of the top plate 20 and the jacket 40 closely adhere to each other via a sealing member, an adhesive, a brazing filler material, or another member that is provided between the bottom surface 24 of the top plate 20, and the jacket 40. Close adhesion means that a refrigerant inside the refrigerant circulation portion 92 does not leak out through the closely adhering portions. Preferably, the top plate 20 and the jacket 40 are brazed. The top plate 20, and jacket 40 may be formed of metal with an identical composition, and the brazing filler material may be formed of a metal having a melting point lower than that of the top plate 20 or the like. The metal that may be used is a metal including aluminum.

Cooling fins 94 are arranged inside the refrigerant circulation portion 92. A cooling fin 94 extends in the z-axis direction, and has two end portions. The cooling fin 94 is thermally and mechanically connected to the bottom surface 24 of the top plate 20 at its upper end, and extends from the bottom surface 24 toward the refrigerant circulation portion 92. A lower end 98 of the cooling fin 94 may be in contact with or apart from the main-body portion 64. If there is a gap therebetween, it is less likely that a stress is generated between the cooling fin 94 and the main-body portion 64 even if a warp or the like of the main-body portion 64 occurs. Heat generated by each semiconductor chip 78, and heat generated by the internal capacitor of the capacitor device 150 can be transferred to a refrigerant passing by the cooling fins 94. Thereby, each semiconductor chip 78, and the internal capacitor of the capacitor device 150 can be cooled.

The cooling fins 94 may include a plurality of columnar or plate-like elements provided almost perpendicularly to the x-y plane. The plurality of elements may be arranged in a predetermined pattern on the x-y plane. The columnar elements may be pins with circular, oval or polygonal cross-sections on an x-y cross-section. The plate-like elements may be planar plates or waveform (zig-zag) plates. Another example of elements of the cooling fins 94 may be a structure composed of plates having a plurality of holes to be flow channels for a refrigerant that are stacked one on another in the z-axis direction. As illustrated in FIG. 3, the cooling fin 94 may be arranged in the jacket 40 such that they are shifted away from the capacitor device 150. Note that the structure of the cooling fins 94 is not limited to the example explained above.

In the present specification, the area provided with the cooling fins 94 is referred to as a finned area 95. In a plan view (in a figure of a view from the z-axis direction perpendicular to the x-y plane in the present example), the finned area 95 may be rectangular, and may have two opposite shorter sides that are parallel to the x-axis direction, and two opposite longer sides that are parallel to the y-axis direction (a first boundary, and a second boundary). The finned area 95 includes an area provided with elements of the cooling fins 94, and flow channels between the elements of the cooling fins 94.

The refrigerant circulation portion 92 is provided with a first refrigerant flow channel 30-1, and second refrigerant flow channel 30-2 that are arranged to sandwich the cooling fins 94 when seen in the plan view. The first refrigerant flow channel 30-1, and second refrigerant flow channel 30-2 in the present example sandwich the cooling fins 94 in the x-axis direction. In addition, each refrigerant flow channel 30 is provided to extend in the y-axis direction (longitudinal direction) along the cooling fins 94. The first refrigerant flow channel 30-1, cooling fins 94, and second refrigerant flow channel 30-2 are arranged in order from the input terminal (N terminals 81, P terminals 82) side.

The main-body portion 64 is provided with opening portions 42 at positions corresponding to the first refrigerant flow channel 30-1, and second refrigerant flow channels 30-2. An opening portion 42-1 that communicates with the first refrigerant flow channel 30-1 can function as an inlet for letting a refrigerant in, and an opening portion 42-2 that communicates with the second refrigerant flow channel 30-2 can function as an outlet for letting the refrigerant out. The opening portion 42-1 may be used as an outlet, and the opening portion 42-2 may be used as an inlet to establish a connection between the cooling device 10 and an external cooling system. Each opening portion 42 may be optionally connected with a pipe 90 for carrying a refrigerant.

The refrigerant flow channels 30 are the space in the refrigerant circulation portion 92 which has a height equal to or greater than a predetermined height (a length in the z-axis direction). The predetermined height may be the distance between the top plate 20 and the main-body portion 64.

The direction (x-axis direction) which is parallel to the bottom surface 24 of the top plate 20, and is perpendicular to the longitudinal direction (y-axis direction) is defined as the width direction of the refrigerant flow channel 30.

Figure 4:
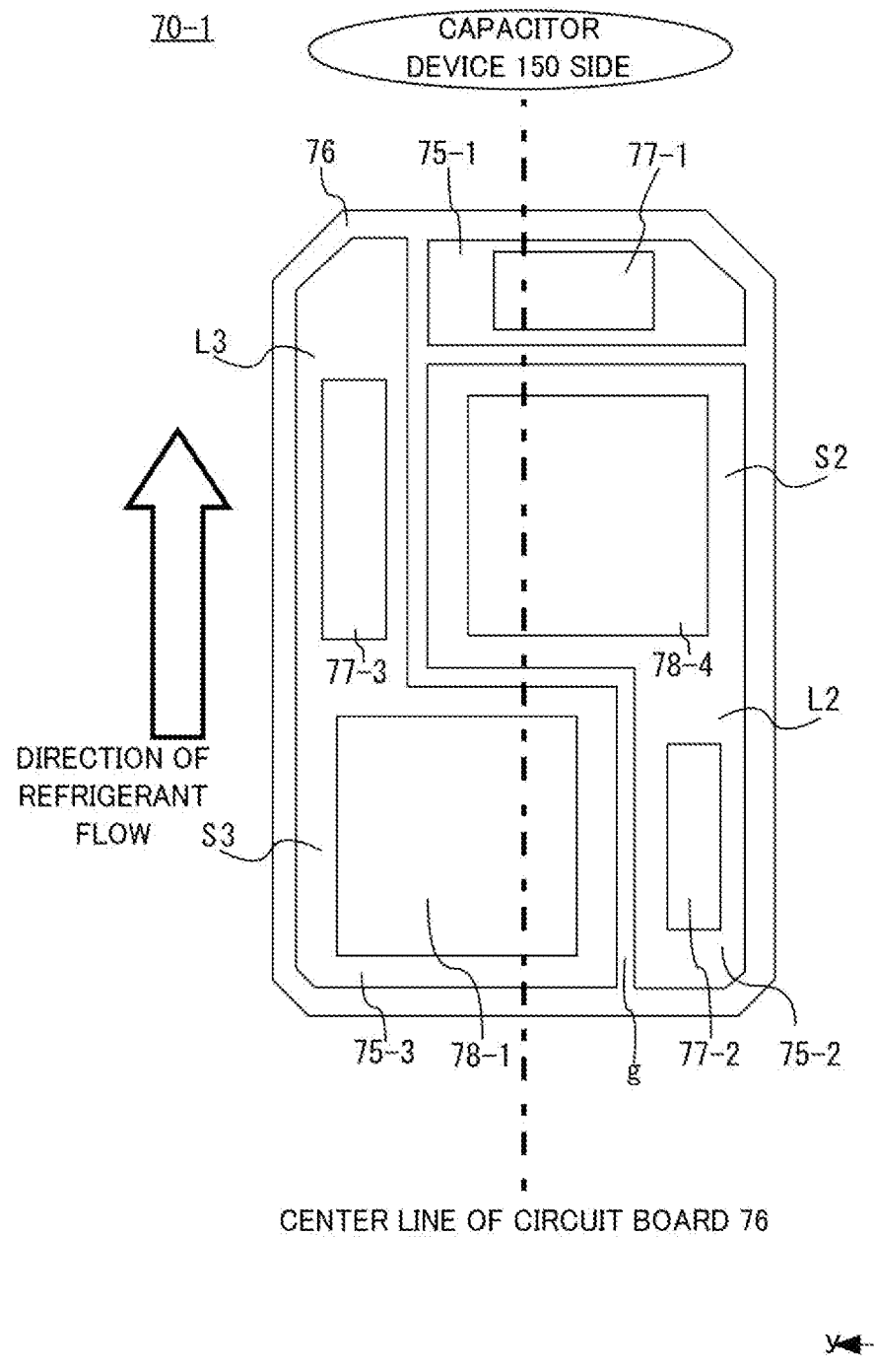
FIG. 4 is a figure illustrating an exemplary arrangement of circuit elements and the like provided on a circuit substrate 76 of a semiconductor device 70, and a direction of flow of refrigerant.
Figure 5:
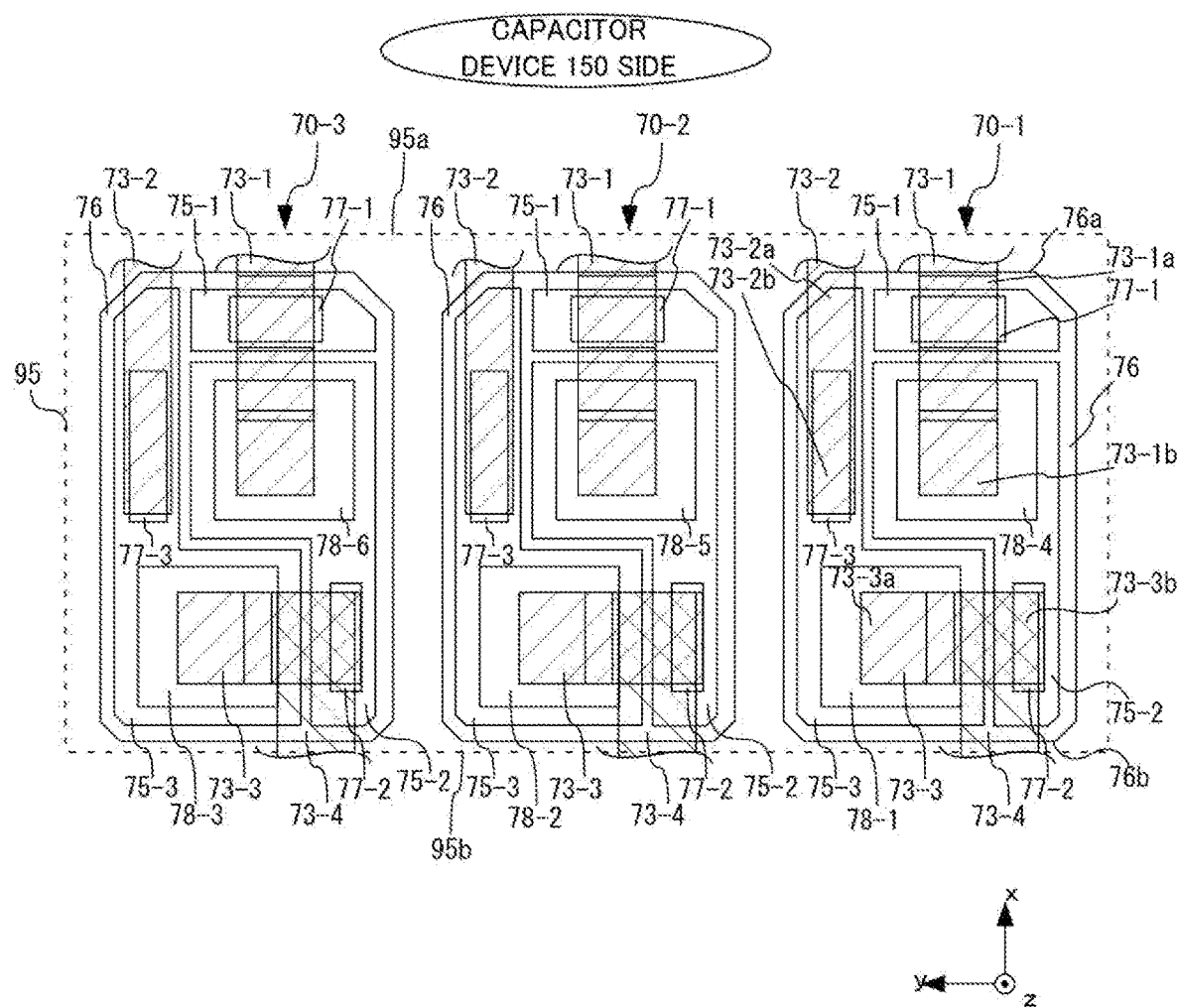
FIG. 5 is a figure illustrating an exemplary arrangement of a finned area 95, and semiconductor devices 70.

FIG. 4 is a plan view illustrating an exemplary arrangement of circuit elements and the like provided on a circuit substrate 76 of a semiconductor device 70, and a direction of flow of refrigerant, and FIG. 5 is a plan view illustrating an exemplary arrangement of a finned area 95, and semiconductor devices 70. FIG. 4 illustrates only a U-phase unit 70-1 included in the semiconductor device 70, and FIG. 5 illustrates the U-phase unit 70-1, a V-phase unit 70-2, and a W-phase unit 70-3. The U-phase unit 70-1, V-phase unit 70-2, and W-phase unit 70-3 may include the same configuration. In the following explanation, the U-phase unit 70-1 is explained.

The U-phase unit 70-1 includes an approximately rectangular circuit substrate 76, and metal bodies 77. The circuit substrate 76 is provided, on its top surface side, with three circuit boards 75-1, 75-2, 75-3 that are separated from each other at predetermined intervals. The circuit boards 75-1, 75-2, 75-3 are provided, on their top surfaces, with metal bodies 77-1, 77-2, 77-3, respectively. The U-phase unit 70-1 further includes a semiconductor chip 78-4 arranged on the circuit board 75-2, and a semiconductor chip 78-1 arranged on the circuit board 75-3.

The circuit board 75-1 is physically connected to the metal body 77-1, that is, contacts the metal body 77-1 directly or indirectly via solder or the like to be thereby connected to the metal body 77-1 also thermally. The circuit board 75-1 has an area larger than the area of contact with the metal body 77-1 when seen in the plan view. In other words, when seen from the top surface side of the circuit substrate 76, the circuit board 75-1 has an area larger than the metal body 77-1. In addition, for example, the circuit board 75-1 is approximately rectangular.

The circuit board 75-2 is physically, electrically, and thermally connected to each of the metal body 77-2, and semiconductor chip 78-4, and has an area larger than the area of contact with the metal body 77-2, and semiconductor chip 78-4 when seen in the plan view. In other words, when seen from the top surface side of the circuit substrate 76, the circuit board 75-2 has an area larger than the total area of the metal body 77-2 and semiconductor chip 78-4. The circuit board 75-2 may include a longer portion (L2), and a shorter portion (S2). The circuit board 75-2 may be composed by a combination of the longer portion and shorter portion, and have an outer edge with an approximately L-shaped pattern when seen in the plan view. The longer portion may be approximately rectangular, and the shorter portion may be approximately square. The longer portion of the circuit board 75-2 may extend in the one direction (x-axis direction) in which the lead frame 73-1, and lead frame 73-2 extend.

The circuit board 75-3 is physically, electrically, and thermally connected to each of the metal body 77-3, and semiconductor chip 78-1, and has an area larger than the area of contact with the metal body 77-3, and semiconductor chip 78-1 when seen in the plan view. In other words, when seen from the top surface side of the circuit substrate 76, the circuit board 75-3 has an area larger than the total area of the metal body 77-3 and semiconductor chip 78-1. The circuit board 75-3 also may include a longer portion (L3), and a shorter portion (S3). The circuit board 75-3 also may be composed by a combination of the longer portion and shorter portion, and have an outer edge with an approximately L-shaped pattern when seen in the plan view. The longer portion may be approximately rectangular, and the shorter portion may be approximately square. The longer portion of the circuit board 75-3 also may extend in the one direction (x-axis direction) in which the lead frame 73-1, and lead frame 73-2 extend.

The circuit board 75-2 may be arranged on the top surface of the circuit substrate 76 such that its longer portion faces the shorter portion of the circuit board 75-3. The longer portion of the circuit board 75-2, and the shorter portion of the circuit board 75-3 may be arranged with a gap (g) of a predetermined width extending in the x-axis direction being provided therebetween. The circuit board 75-3 may be arranged on the top surface of the circuit substrate 76 such that its longer portion faces the shorter portion of the circuit board 75-2. The longer portion of the circuit board 75-3, and the shorter portion of the circuit board 75-2 may be arranged with a gap of a predetermined width extending in the x-axis direction being provided therebetween. The circuit board 75-2, and circuit board 75-3 may have patterns that substantially match if they are rotated clockwise about a given point. The length of the lateral direction of the circuit board 75-1, the length of the lateral direction of the longer portion of the circuit board 75-2, and the length of the lateral direction of the longer portion of the circuit board 75-3 are approximately equal to each other, for example. In addition, for example, the circuit board 75-1, circuit board 75-2, and circuit board 75-3 may be separated from each other by a constant width which is approximately one sixth of the length.

The metal bodies 77 (a metal body, and a second metal body) may be metallic blocks which are rectangular parallelepipeds. The metal bodies 77 may have at least a bottom surface which is parallel to the x-y plane, and a height (thickness) in the z-axis direction. By providing the metal bodies 77 with predetermined volumes between the lead frames 73, and circuit boards 75, the lead frames 73, and circuit boards 75 can be coupled electrically, mechanically, and moreover thermally. With the metal bodies 77 having a predetermined height, the sealing portion 74 can be filled between the lead frames 73, and circuit boards 75 without producing empty spaces therein.

The metal body 77-1 is approximately rectangular when seen in the plan view, and is approximately centered on the top surface of the circuit board 75-1, and its longitudinal direction approximately coincides with the longitudinal direction (y-axis direction) of the circuit board 75-1. When seen from the top surface side of the circuit substrate 76, the vertical and horizontal dimensions of the metal body 77-1 are smaller than any of the vertical and horizontal dimensions of the circuit board 75-1, and for example there are areas around the metal body 77-1 where portions of the circuit boards 75-1 are not in contact with the metal body 77-1.

The metal body 77-2 is approximately rectangular when seen in the plan view, and is approximately centered on the top surface of the longer portion of the circuit board 75-2, and its longitudinal direction approximately coincides with the longitudinal direction (x-axis direction) of the longer portion of the circuit board 75-2. When seen from the top surface side of the circuit substrate 76, the vertical and horizontal dimensions of the metal body 77-2 are smaller than any of the vertical and horizontal dimensions of the longer portion of the circuit board 75-2, and for example there are areas around the metal body 77-2 where portions of the circuit boards 75-2 are not in contact with the metal body 77-2.

The metal body 77-3 is approximately rectangular when seen in the plan view, and is approximately centered on the top surface of the longer portion of the circuit board 75-3, and its longitudinal direction approximately coincides with the longitudinal direction (x-axis direction) of the longer portion of the circuit board 75-3. When seen from the top surface side of the circuit substrate 76, the vertical and horizontal dimensions of the metal body 77-3 are smaller than any of the vertical and horizontal dimensions of the longer portion of the circuit board 75-3, and for example there are areas around the metal body 77-3 where portions of the circuit boards 75-3 are not in contact with the metal body 77-3.

The semiconductor chip 78-1, and semiconductor chip 78-4 are connected to the shorter portions of the circuit board 75-3, and circuit board 75-2, respectively. Both the semiconductor chip 78-1, and semiconductor chip 78-4 have external forms which are approximately rectangular or approximately square, for example, and when seen from the top surface side of the circuit substrate 76, the vertical and horizontal dimensions of each of the semiconductor chip 78-1, and semiconductor chip 78-4 are smaller than any of the vertical and horizontal dimensions of the shorter portions of the circuit board 75-3, and circuit board 75-2. For example, there are areas around the semiconductor chip 78-1, and semiconductor chip 78-4 where portions of the circuit board 75-3, and circuit board 75-2 are not in contact with the semiconductor chip 78-1, and semiconductor chip 78-4, respectively.

In addition, when seen from the direction of extension (the x-axis direction) of the longer portions of the circuit board 75-2, and circuit board 75-3, the semiconductor chip 78-1, and semiconductor chip 78-4 overlap with each other only partially. In other words, the semiconductor chip 78-1, and semiconductor chip 78-4 are staggered such that they are shifted in the opposite directions (the y-axis direction) relative to the center line of the circuit substrate 76 extending in the longitudinal direction of the circuit substrate 76 illustrated in FIG. 4. Note that the semiconductor chip 78-1, and semiconductor chip 78-4 may completely overlap, that is, coincide with each other when seen from the x-axis direction.

An attempt to reduce the size of the semiconductor module 100 inevitably results in a smaller circuit substrate 76, and individual semiconductor chips on the circuit substrates 76 are also arranged close to each other; as a result, thermal interference inadvertently occurs between the semiconductor chips. In contrast to this, as explained above, in the semiconductor module 100 according to the present embodiment, the circuit boards 75-3, 75-2 on which the semiconductor chips 78-1, 78-4 are arranged both have approximately L-shaped patterns, and are arranged on the top surface of the circuit substrate 76 separately from each other such that their longer portions face each other in the y-axis direction, and their shorter portions face each other in the x-axis direction. With this arrangement, the small area on the circuit substrate 76 is used without wasting any part of it. Furthermore, as illustrated in FIG. 4, the semiconductor chips 78-1, 78-4 are staggered relative to the center line of the circuit substrate 76 extending in the longitudinal direction of the circuit substrate 76, and also a refrigerant flow in the same direction as the longitudinal direction of the circuit substrate 76 in the cooling device 10 underlying the semiconductor device 70; therefore, a refrigerant that is relatively less affected by heat generated at one of semiconductor chips or the like can easily reach a portion underlying the other semiconductor chip.

As illustrated in FIG. 4, the metal body 77-3 is arranged close to the capacitor device 150, and additionally is arranged on the metal pad 75-2 on which also the semiconductor chip 78-1 is arranged. With this arrangement, the metal body 77-3 is affected by heat generation of both the capacitor device 150, and semiconductor chip 78-1. On the other hand, as illustrated in FIG. 4, the metal body 77-1 is arranged closer to the capacitor device 150, but is arranged on the metal pad 75-1 separated from the metal pad 75-2 on which the semiconductor chip 78-4 is arranged. With this arrangement, although the metal body 77-1 is affected by heat generation of the capacitor device 150, it is less likely that the metal body 77-1 is affected by heat generation of the semiconductor chip 78-4. As illustrated in FIG. 5 mentioned below, although the metal body 77-3 is connected to a P terminal 82 via a conductive member, and the metal body 77-1 is connected to an N terminal 81 via another conductive member, there is a difference between the amounts of heat that the metal body 77-3, and metal body 77-1 receive from the outside, as mentioned above.

In view of this, about the metal body 77-3, and metal body 77-1, the area of the bottom surface of the metal body 77-3 may be larger than the area of the bottom surface of the metal body 77-1; in other words, the bottom surface area of the metal body 77-1 may be smaller than the bottom surface area of the metal body 77-3. Preferably, as compared with the metal body 77-1, the shorter sides of the bottom surface of the metal body 77-3 may be relatively short, and its longer sides may be relatively long. By adopting such a shape, the heat-dissipation efficiency of the metal body 77-3 can be increased relatively.

In the semiconductor device 70, the longer sides of the bottom surface of the metal body 77-1 may be shorter than the longer sides of the bottom surface of the metal body 77-3, the longer sides of the bottom surface of the metal body 77-1 may be orthogonal to the x-axis direction, and the longer sides of the bottom surface of the metal body 77-3 may be parallel to the x-axis direction. By providing the metal bodies 77-1, 77-3 in this manner, the device can be downsized.

The metal body 77-3, and metal body 77-1 may have the same height, and in the case explained above, the volume of the metal body 77-3 also increases relatively, and accordingly the thermal capacity of the metal body 77-3 also increases relatively. In this manner, the semiconductor module 100 according to the present embodiment has the metal body 77-3, and metal body 77-1 with configurations that are modified according to the difference in amounts of heat that the metal body 77-3, and metal body 77-1 connected to the P terminal 82, and N terminal 81, respectively, receive from the outside; therefore, the P terminal 82, and N terminal 81 can be cooled to the approximately same degree.

FIG. 5 illustrates four lead frames 73-1, 73-2, 73-3, 73-4 in each of the U-phase unit 70-1, V-phase unit 70-2, and W-phase unit 70-3. In addition, the finned area 95 mentioned above that is located at the bottom surface 24 of the top plate 20 of the cooling device 10, and in which the cooling fins 94 are provided is indicated by a broken line, and all the U-phase unit 70-1, V-phase unit 70-2, and W-phase unit 70-3 are disposed inside the finned area 95. The finned area 95 has a first boundary 95a on the side (x-axis positive side) closer to input terminals (N terminals 81, P terminals 82), and a second boundary 95b on the side (x-axis negative side) closer to output terminals 83 which side is opposite to the first boundary 95a. The circuit substrates 76 have first ends 76a on the side closer to input terminals (N terminals 81, P terminals 82), and second ends 76b on the side closer to output terminals 83 which side is opposite to the first ends 76a.

The U-phase unit 70-1, V-phase unit 70-2, and W-phase unit 70-3 may have identical configurations. In the following explanation, the configuration of the U-phase unit 70-1 is explained mainly, and duplicate explanations of the V-phase unit 70-2, and W-phase unit 70-3 are omitted.

The lead frame 73-1 has a belt-like shape with an approximately constant width, for example, and extends in the longitudinal direction (x-axis direction) of the U-phase unit 70-1 which is approximately rectangular. The lead frame 73-1 is an exemplary wiring portion, and has one end 73-1a, and the other end 73-1b which are physically, electrically, and thermally connected to an N terminal 81, and the top surface of the semiconductor chip 78-4, respectively. The widths of the one end 73-1a, and the other end 73-1b in the y-axis direction may be the same or different. The lead frame 73-1 is physically and thermally connected to the metal body 77-1 at the approximately middle thereof in the direction of extension between the one end 73-1a and the other end 73-1b. In other words, the metal body 77-1 is connected closer to the N terminal 81 relative to the semiconductor chip 78-4 in the lead frame 73-1. The metal body 77-1 is connected to the lead frame 73-1, and the top surface of the circuit substrate 76. In addition, when seen in the plan view, the metal body 77-1 is disposed at a position which is on the top surface of the circuit substrate 76, and corresponds to the finned area 95. With such a configuration, heat generated by the semiconductor chip 78-4, and the internal capacitor of the capacitor device 150 is transferred efficiently to the cooling fins 94 of the cooling device 10 via at least the lead frame 73-1, and metal body 77-1. The semiconductor chip 78-4, and the internal capacitor of the capacitor device 150 can be cooled efficiently. Note that heat generated by the semiconductor chip 78-4 is released into the cooling device 10 also in a path that passes through the circuit board 75-2, and circuit substrate 76.

The lead frame 73-2 has a belt-like shape with an approximately constant width, and extends in the longitudinal direction (x-axis direction) of the U-phase unit 70-1 which is approximately rectangular. The lead frame 73-2 is an exemplary second wiring portion, and has one end 73-2a, and the other end 73-2b which are physically, electrically, and thermally connected to a P terminal 82, and the metal body 77-3, respectively. The widths of the one end 73-2a, and the other end 73-2b in the y-axis direction may be the same or different. The metal body 77-3 is positioned on the longer portion of the metal circuit board 75-3, and is positioned closer to the P terminal 82 relative to the semiconductor chip 78-1. The metal body 77-3 is connected to the lead frame 73-2, and the top surface of the circuit substrate 76. In addition, when seen in the plan view, the metal body 77-3 is disposed at a position which is on the top surface of the circuit substrate 76, and corresponds to the finned area 95. Such arrangement allows transfer of heat generated by the internal capacitor of the capacitor device 150 to the cooling device 10 via the lead frame 73-2, and metal body 77-3. The arrangement of the lead frames 73-1, 73-2, and metal bodies 77-1, 77-3 allows efficient cooling of the internal capacitor of the capacitor device 150.

The lead frame 73-3 has a belt-like shape with an approximately constant width, and extends in the lateral direction (y-axis direction) of the U-phase unit 70-1 which is approximately rectangular. The lead frame 73-3 has one end 73-3a, and the other end 73-3b that are physically, electrically, and thermally connected to the top surface of the semiconductor chip 78-1, and the metal body 77-2, respectively. Such a configuration allows transfer of heat generated by the semiconductor chip 78-1 to the cooling device 10 via the lead frame 73-3, and metal body 77-2, and the semiconductor chip 78-1 can be cooled efficiently. Note that heat generated by the semiconductor chip 78-1 is released into the cooling device 10 also in a path that passes through the circuit board 75-3, and circuit substrate 76.

The lead frame 73-4 has a belt-like shape with an approximately constant width, and extends in the longitudinal direction (x-axis direction) of the U-phase unit 70-1 which is approximately rectangular. The lead frame 73-4 has one end, and the other end that are physically, electrically, and thermally connected to the top surface of the lead frame 73-3, and output terminals 83 (83U, 83V, 83W), respectively.

As illustrated in FIG. 5, in the semiconductor module 100 according to the present embodiment, the metal body 77-3 is arranged at a longer distance from the first end 76a of the circuit substrate 76 than the metal body 77-1 is. The metal body 77-3 is arranged such that its longer sides become parallel to the direction of extension of the lead frame 73-2. The width of the lead frame 73-2 may be smaller than that of the lead frame 73-1 when seen in the plan view. Such a configuration makes it relatively easier for the lead frame 73-2 to bend; as a result, it makes it easier to establish connections between the lead frame 73-2, metal body 77-3, and P terminal 82. The lead frame 73-2, metal body 77-3, and P terminal 82 may be bonded by soldering, or welding such as laser welding, TIG welding, or resistance welding.

Note that as illustrated in FIG. 1, the lead frame 73-1, lead frame 73-2, lead frame 73-3, and lead frame 73-4 may have shapes that are bent to have multiple steps in the z-axis direction. Note that the lead frame 73-3, and lead frame 73-4 are separate bodies, and partially overlap to be physically, electrically, and thermally connected, but they may be an integrated body.

Figure 6:
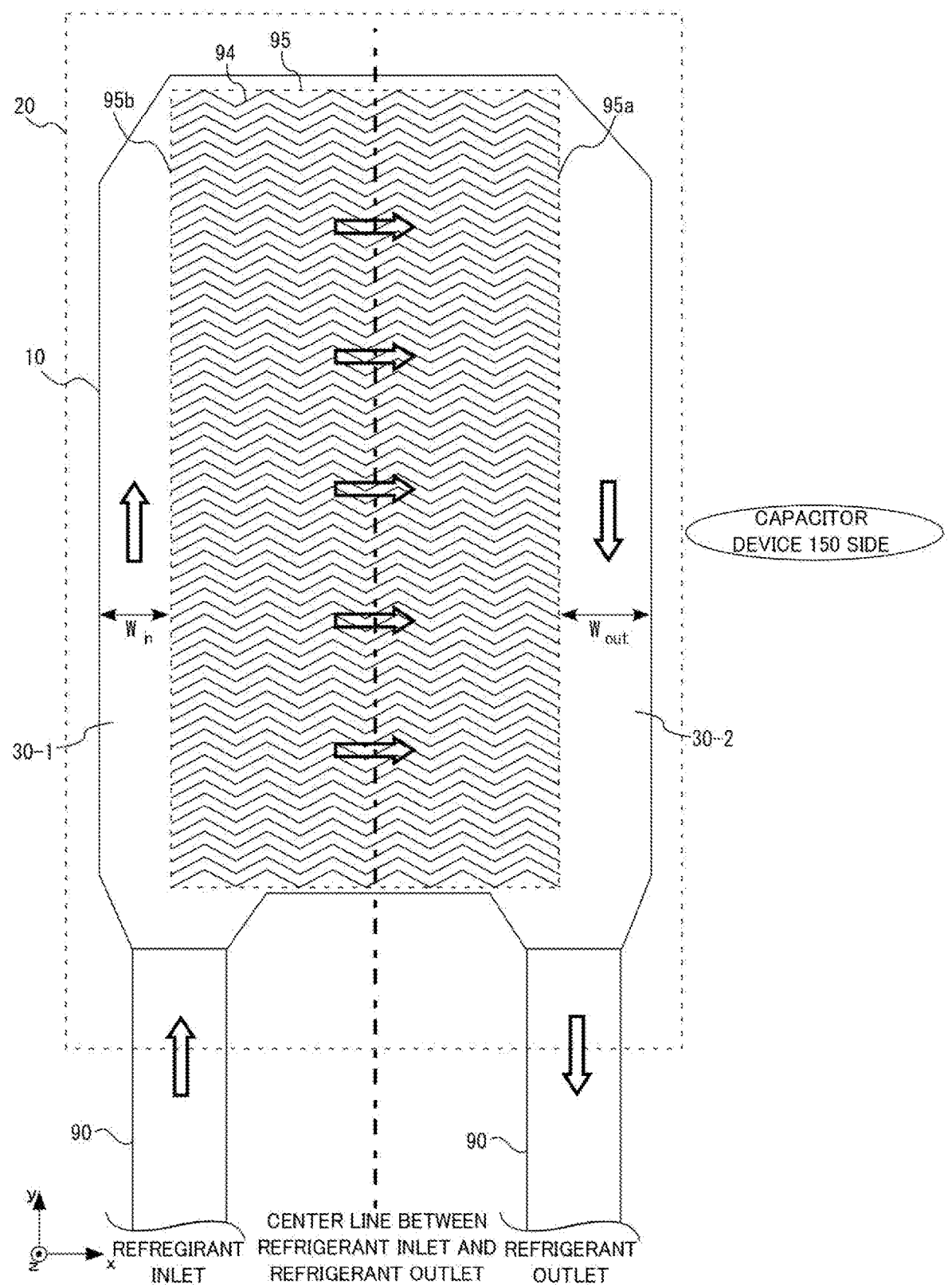
FIG. 6 is a figure illustrating an exemplary arrangement of the finned area 95 in a cooling device 10, the shape of cooling fins 94, and a direction of flow of refrigerant.
Figure 7:
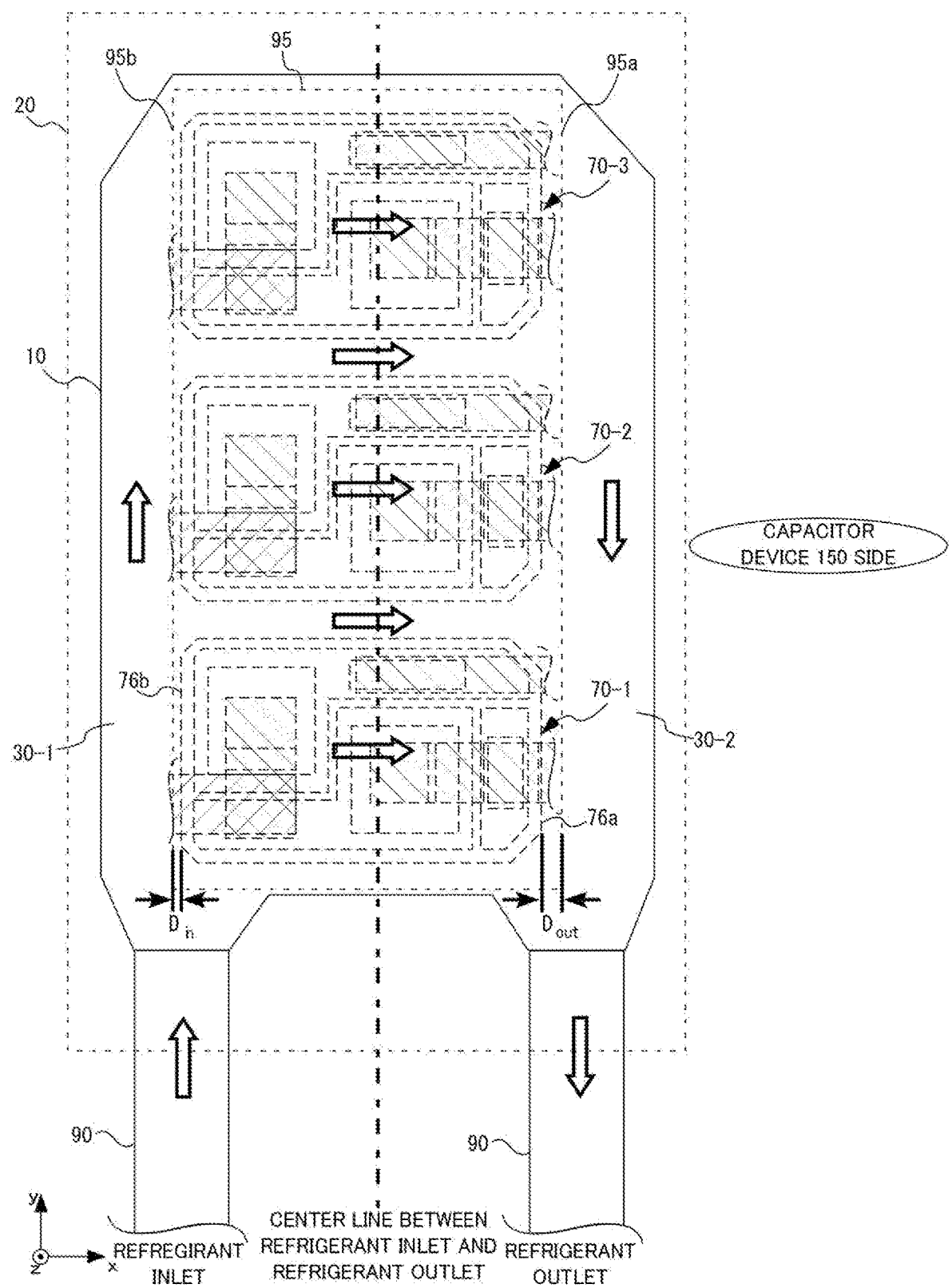
FIG. 7 is a figure illustrating an exemplary arrangement of the finned area 95 in the cooling device 10 and semiconductor device 70, and a direction of flow of refrigerant.

FIG. 6 is a figure illustrating an exemplary arrangement of the finned area 95 in the cooling device 10, the shape of cooling fins 94, and a direction of flow of refrigerant, and FIG. 7 is a figure illustrating an exemplary arrangement of the finned area 95 in the cooling device 10 and semiconductor devices 70, and a direction of flow of refrigerant. In each figure, a pipe 90 illustrated on the left side as seen in the figure is a refrigerant inlet, and a pipe 90 illustrated on the right side as seen in the figure is a refrigerant outlet. In addition, outline arrows schematically illustrate how a refrigerant having flowed in from the inlet passes through the first refrigerant flow channel 30-1, passes between the cooling fins 94, passes through the second refrigerant flow channel 30-2, and flows out from the outlet.

As illustrated in FIG. 6, the cooling fins 94 of the cooling device 10 according to the present embodiment are a plurality of plate-like structures that are provided almost perpendicularly to the x-y plane, and are arranged in a waveform pattern on the x-y plane. In FIG. 6, the x-direction distance from a side wall of the first refrigerant flow channel 30-1 positioned on the left side as seen in the figure to the second boundary 95b of the finned area 95 is indicated as Win, and the x-direction distance from a side wall of the second refrigerant flow channel 30-2 positioned on the right side as seen in the figure to the first boundary 95a of the finned area 95 is indicated as Wout. In addition, similarly, in FIG. 7, the x-direction distance from a longer side (second boundary 95b) of the finned area 95 positioned on the left side as seen in the figure to the first ends 76a of the U-phase unit 70-1, V-phase unit 70-2, and W-phase unit 70-3 is indicated as Din, and the x-direction distance from a longer side (first boundary 95a) of the finned area 95 positioned on the right side as seen in the figure to the second ends 76b of the U-phase unit 70-1, V-phase unit 70-2, and W-phase unit 70-3 is indicated as Dout.

The semiconductor module 100 preferably (1) satisfies a first relationship "Dout>Din", that is, preferably, the cooling fins 94 are shifted to the capacitor device 150 (P terminals 82 and N terminals 81 of the semiconductor module 100) relative to the circuit substrates 76. In other words, as illustrated in FIG. 7, the circuit substrates 76 are preferably shifted to the left side in the x-direction on the finned area 95 as seen in the figure, that is, away from the capacitor device 150. Since, if the first relationship is satisfied, the entire metal bodies 77-1, 77-3 are arranged on the cooling fins 94, and their area of thermal connection becomes larger, the semiconductor module 100 can surely have a sufficient path from the capacitor device 150 to the cooling device 10, and lower the temperature of the terminals 153 of the capacitor device 150.

In addition, in the semiconductor module 100, preferably (2) the circuit substrates 76 are arranged far away from the capacitor device 150 (P terminals 82 and N terminals 81 of the semiconductor module 100) relative to the center line between the refrigerant inlet and the refrigerant outlet. With this arrangement, the semiconductor module 100 can provide effects that are the same as those explained above.

In addition, the semiconductor module 100 can have a uniform flow of refrigerant at portions below a plurality of circuit substrates 76 by (3) satisfying a second relationship "Wout>Win", that is, making a cross-sectional area of the first refrigerant flow channel 30-1 on the refrigerant inlet side relatively small.

The semiconductor module 100 preferably satisfies the conditions (1), (2), and (3) in this order, and the semiconductor module 100 in the present embodiment satisfies all the conditions (1), (2), and (3), for example.

According to the inverter 1 in the first embodiment explained above, heat of the semiconductor devices 70, and capacitor device 150 resulting from operation of the inverter 1 can be transferred efficiently to the cooling device 10, and so the cooling efficiency of the entire inverter 1 including the capacitor device can improve.

In the inverter 1 of the first embodiment explained above, the semiconductor device 70 includes the metal bodies 77-1 between the N terminals 81, and the semiconductor chips 78-4, 78-5, 78-6. In contrast to this inverter 1, an inverter as a comparative example with semiconductor devices not provided with the metal bodies 77-1 is prepared, and temperature increase in an internal capacitor was simulated. The result of the simulation showed that temperature increase of the internal capacitor in the inverter according to the comparative example was 13.6° C.; on the other hand, temperature increase of the internal capacitor in the inverter 1 according to the first embodiment was 1.9° C. lower at 11.7° C., thereby confirming a 15%-reduction of heat generation of the internal capacitor.

In this manner, since the inverter 1 can enhance the efficiency of cooling the internal capacitor, it is possible to design smaller capacitance for the internal capacitor, thereby allowing scale reduction of the internal capacitor, and cost reduction of the internal capacitor.

Figure 8:
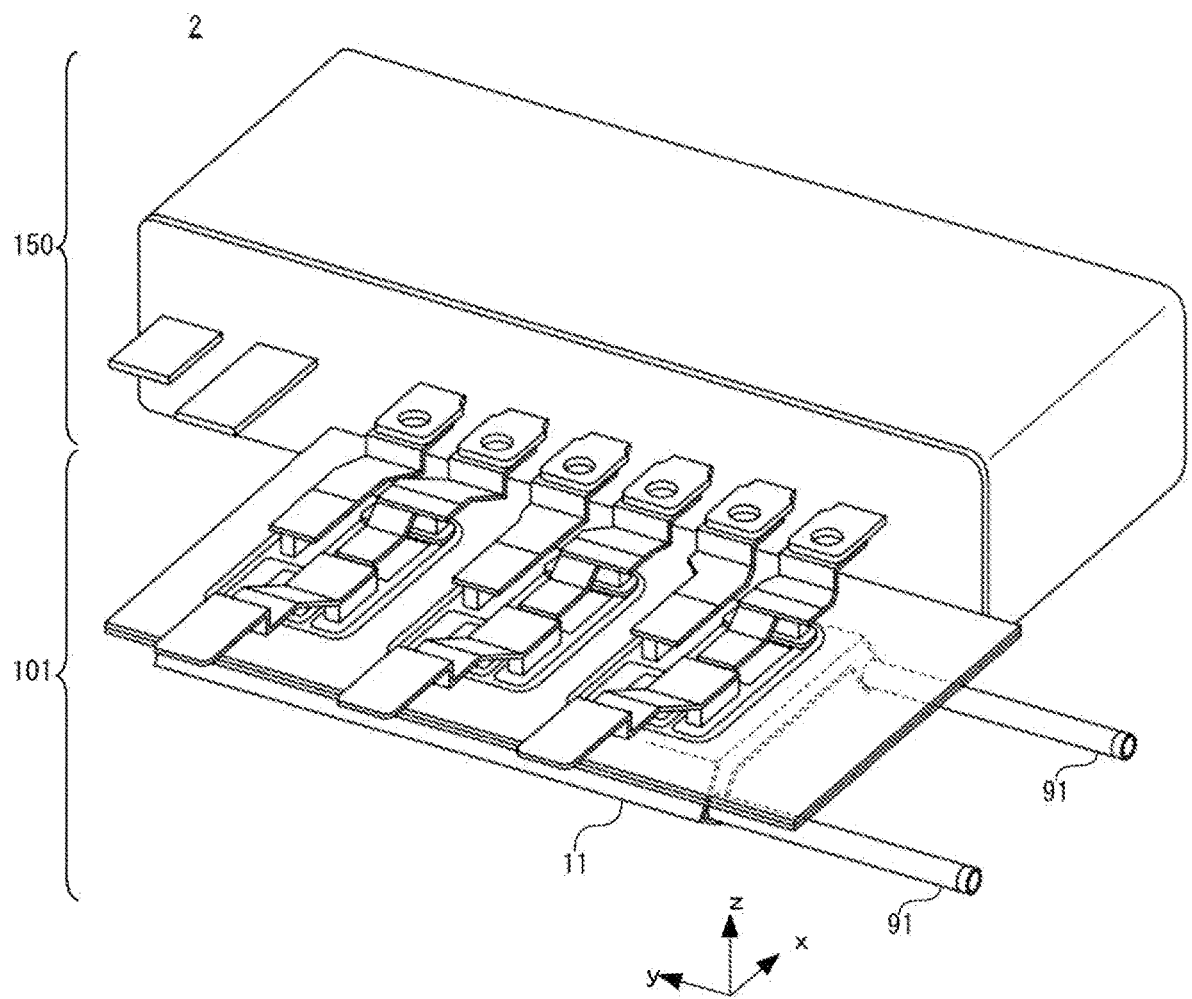
FIG. 8 is a schematic perspective view illustrating an exemplary inverter 2 according to a second embodiment of the present invention.

FIG. 8 is a schematic perspective view illustrating an exemplary inverter 2 according to a second embodiment of the present invention. As illustrated also in FIG. 9, the inverter 2 according to the second embodiment is different from the inverter 1 according to the first embodiment mainly in that a cooling device 11 of a semiconductor module 101 has inclined portions 32 extending in the z-axis negative direction at both ends of the cooling device 11 in the x-axis direction, and two pipes 91 for letting a refrigerant into and out of the cooling device 11 are connected at lower portions of the inclined portions 32. For configurations of the inverter 2 in the second embodiment that are similar to those in the inverter 1 according to the first embodiment, reference numerals similar to those used for the configurations in the inverter 1 are used, and duplicate explanations that are the same as explanations for the first embodiment are omitted hereinafter.

Figure 9:
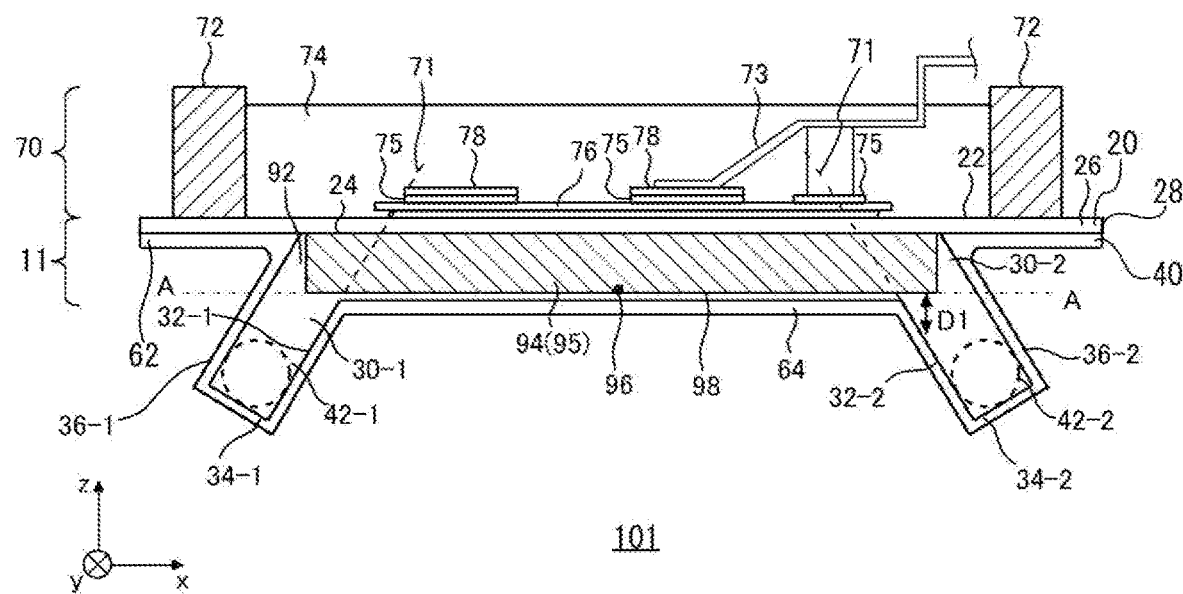
FIG. 9 is a schematic cross-sectional view illustrating an exemplary semiconductor module 101 according to the second embodiment of the present invention.

FIG. 9 is a schematic cross-sectional view illustrating the exemplary semiconductor module 101 according to the second embodiment of the present invention. Each of a first refrigerant flow channel 30-1, and a second refrigerant flow channel 30-2 in the cooling device 11 in the semiconductor module 101 has a flow channel bottom surface. A flow channel bottom surface is a surface to be in contact with a refrigerant, and is an upward-facing surface. The flow channel bottom surfaces in the present example has inclined portions 32 (32-1, 32-2), and bottom portions 34 (34-1, 34-2). The inclined portions 32 have distances D1 to the lower end 98 of the cooling fins 94 in the z-axis direction that decrease as the distances to a middle position 96 of the finned area 95 in the x-axis direction decrease. For example, the inclined portion 32-1 arranged on the x-axis negative side and on the z-axis negative side relative to the cooling fins 94 is positively sloped in terms of the x axis, and z axis. In addition, the inclined portion 32-2 arranged on the x-axis positive side and on the z-axis negative side relative to the cooling fins 94 is negatively sloped in terms of the x axis, and z axis.

In addition, in each of the first refrigerant flow channel 30-1, and second refrigerant flow channel 30-2, at least part of the inclined portion 32 is provided below the cooling fins 94. In at least one of the first refrigerant flow channel 30-1, and second refrigerant flow channel 30-2, the entire inclined portion 32 may be provided below the cooling fins 94. In addition, each opening portion 42 is arranged near the lower end of the inclined portion 32 in the z-axis direction.

By providing such inclined portions 32, it is possible to cause a refrigerant let in from any of the opening portion 42 to flow toward the lower end 98 of the cooling fins 94. Because of this, it is possible to make the refrigerant circulate efficiently to an area of the cooling fins 94 close to the top plate 20, and is possible to cool each semiconductor chip 78 and the internal capacitor of the capacitor device 150 efficiently.

In particular, as illustrated in FIG. 9, if a space is provided between the lower end 98 of the cooling fins 94, and the main-body portion 64, a refrigerant flows to the space, and the efficiency of cooling the semiconductor devices 70, and the internal capacitor of the capacitor device 150 lowers, but according to the present example, it is possible to cause a refrigerant to circulate to an area close to the top plate 20, and to cool each semiconductor chip 78, and the internal capacitor of the capacitor device 150 efficiently.

Note that in an x-z cross-section, straight lines 71 extended from the individual inclined portions 32 may intersect the semiconductor chips 78, and metal bodies 77, respectively. Thereby, it becomes easier to cause a refrigerant to flow toward the individual semiconductor chips 78, and metal bodies 77, and it is possible to cool each semiconductor chip 78, and the internal capacitor of the capacitor device 150 efficiently.

The bottom portions 34 are surfaces connected to the inclined portions 32. The bottom portions 34 may be inclined to the x axis in opposite directions to the inclined portions 32, and may be parallel to the x axis. In addition, the main-body portions 64 may have side walls 36 (36-1, 36-2). The side walls 36 connect the bottom portions 34, and the frame portion 62. The side walls 36 may be provided parallel to the inclined portions 32 on the x-z plane. Thereby, it becomes still easier to cause a refrigerant let in from an opening portion 42 to flow toward the lower end 98 of the cooling fins 94. It should be noted however that the side walls 36 may be provided not parallel to the inclined portions 32 on the x-z plane.

Figure 10:
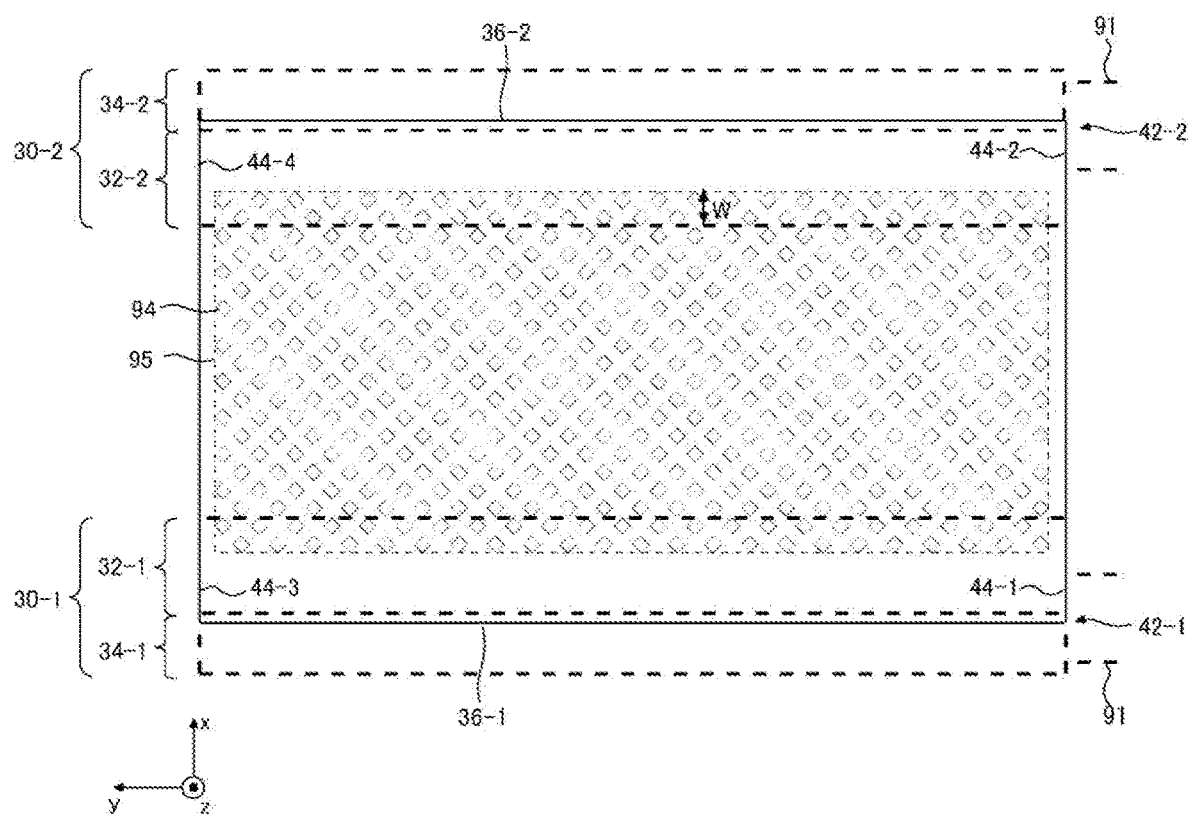
FIG. 10 is a figure illustrating an exemplary arrangement of cooling fins 94, a first refrigerant flow channel 30-1, and a second refrigerant flow channel 30-2 on the x-y plane.

FIG. 10 is a figure illustrating an exemplary arrangement of the cooling fins 94, first refrigerant flow channel 30-1, and second refrigerant flow channel 30-2 on the x-y plane. FIG. 10 represents a figure in which the first refrigerant flow channel 30-1, and second refrigerant flow channel 30-2 are projected onto a plane (A-A plane in FIG. 9) parallel to the lower end 98 of the cooling fins 94. In FIG. 10, the positions of the inclined portions 32, and bottom portions 34 on the plane are indicated by broken lines. In addition, the positions of the side walls 36 on the plane are indicated by solid lines. The cooling fins 94 illustrated in FIG. 10 are rod-like structures dispersed on the x-y plane, but the structures of the cooling fins 94 are not limited to this.

Each refrigerant flow channel 30 has two end portions 44 in the y-axis direction. In FIG. 10, the first refrigerant flow channel 30-1 has a first end portion 44-1, and a third end portion 44-3, and the second refrigerant flow channel 30-2 has a second end portion 44-2, and a fourth end portion 44-4. The first end portion 44-1, and second end portion 44-2 are end portions on the same side, and the third end portion 44-3, and fourth end portion 44-4 are end portions on the same side. Being on the same side means that relative positions in the y-axis direction of two end portions 44 are on the same side relative to the other end portions of the same refrigerant flow channels. For example, the first end portion 44-1 is arranged on the y-axis positive side relative to the third end portion 44-3, and the second end portion 44-2 is arranged on the y-axis positive side relative to the fourth end portion 44-4. This means that the first end portion 44-1, and second end portion 44-2 are both arranged on the y-axis positive side. When seen in the plan view, the longitudinal directions of the first refrigerant flow channel 30-1, and second refrigerant flow channel 30-2 may be parallel to each other in the y-axis direction, and moreover may be parallel to longer sides of the finned area 95, and longer sides of the top plate 20.

The first opening portion 42-1 is provided closer to the first end portion 44-1 in the first refrigerant flow channel 30-1. In addition, the second opening portion 42-2 is provided closer to the second end portion 44-2 in the second refrigerant flow channel 30-2. This means that the two opening portions 42 are provided on the same side of the refrigerant flow channels 30 in the jacket 40. Each opening portion 42 is connected with a pipe 91 through which a refrigerant is carried.

As has been explained with reference to FIG. 9, each refrigerant flow channel 30 is arranged overlapping the cooling fins 94. More specifically, each refrigerant flow channel 30 is arranged to have a predetermined overlapping width W in the x-axis direction over which it overlaps the finned area 95, across the entire length of the finned area 95 in the y-axis direction indicated by a broken line in FIG. 10. The overlapping width W may be constant regardless of positions in the y-axis direction, or may vary in the y-axis direction. In addition, the first refrigerant flow channel 30-1, and second refrigerant flow channel 30-2 may have the same overlapping width W, or different overlapping widths W.

Figure 11:
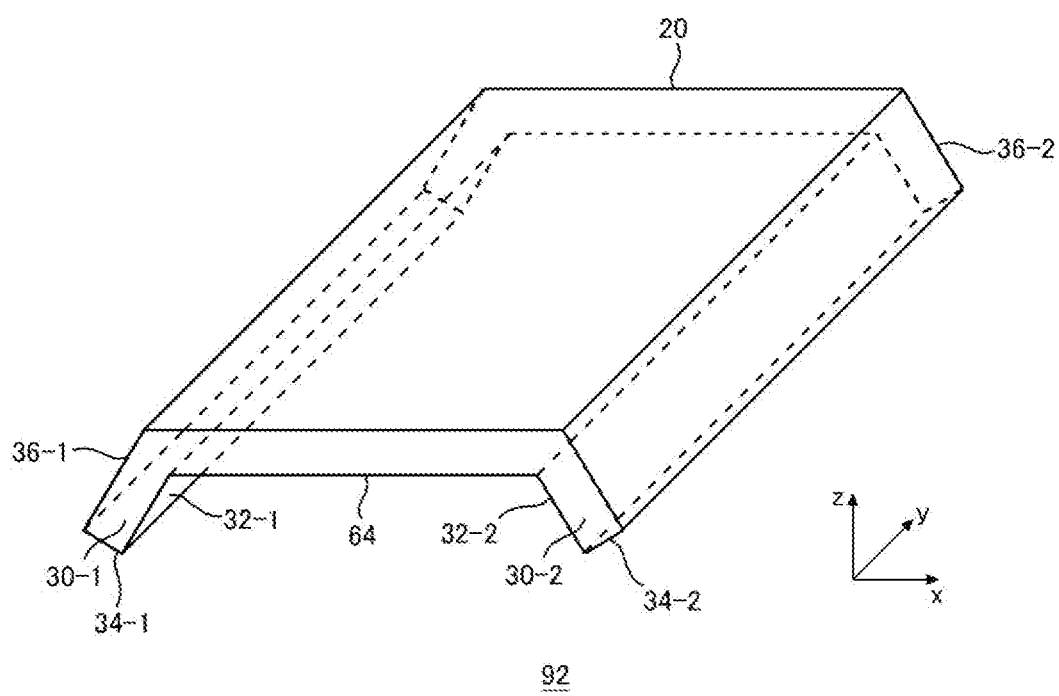
FIG. 11 is a perspective view illustrating main points of a refrigerant circulation portion 92.

FIG. 11 is a perspective view illustrating main points of the refrigerant circulation portion 92. As has been explained with reference to FIG. 9 and FIG. 10, the refrigerant circulation portion 92 has refrigerant flow channels 30 extending in the y-axis direction at its both ends in the x-axis direction. Each refrigerant flow channel 30 has an inclined portion 32 that slopes inward in terms of the x-axis direction from an outer side, and gradually upward in terms of the z-axis direction. The outer side in the x-axis direction means a side which is farther from the middle of refrigerant circulation portion 92 in the x-axis direction, and the inner side means a side closer to the middle of the refrigerant circulation portion 92. In the example illustrated in FIG. 11, each inclined portion 32 is provided over the entire length of the refrigerant circulation portion 92 in the y-axis direction.

Also with the inverter 2 according to the second embodiment explained above, effects similar to those attained with the inverter 1 according to the first embodiment can be attained.

Figure 12:
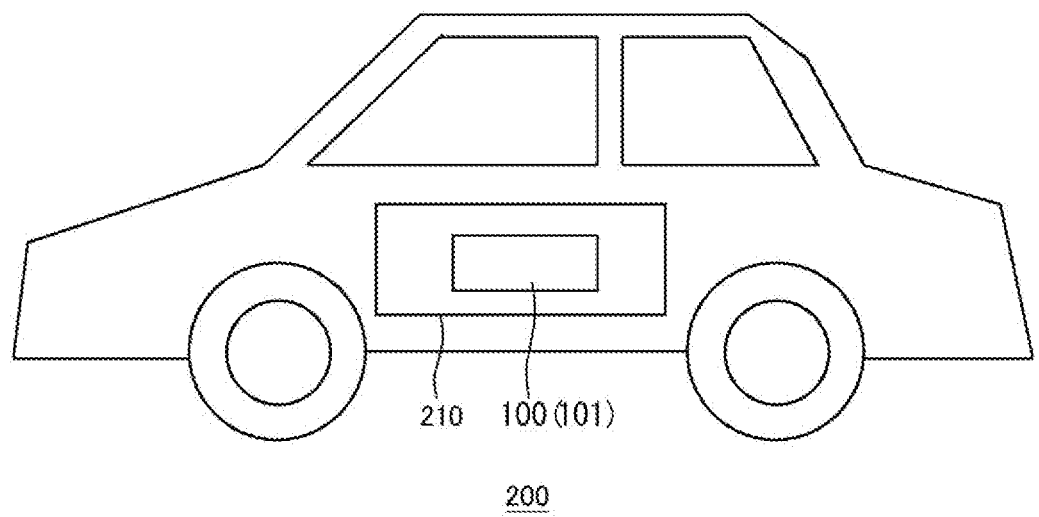
FIG. 12 is a figure illustrating main points of a vehicle 200 according to a third embodiment of the present invention.

FIG. 12 is a figure illustrating main points of a vehicle 200 according to a third embodiment of the present invention. The vehicle 200 is a vehicle that generates at least partial thrust by using electrical power. For example, the vehicle 200 is an electric automobile that generates entire thrust by using a power-driven instrument such as a motor, or a hybrid automobile that use, in combination, a power-driven instrument such as a motor, and an internal-combustion engine driven by fuel such as gasoline.

The vehicle 200 includes a control device 210 (outside device) that controls a power-driven instrument such as a motor. The control device 210 is provided with the semiconductor module 100 (101). The semiconductor module 100 (101) may control electrical power to be supplied to the power-driven instrument.

Figure 13:
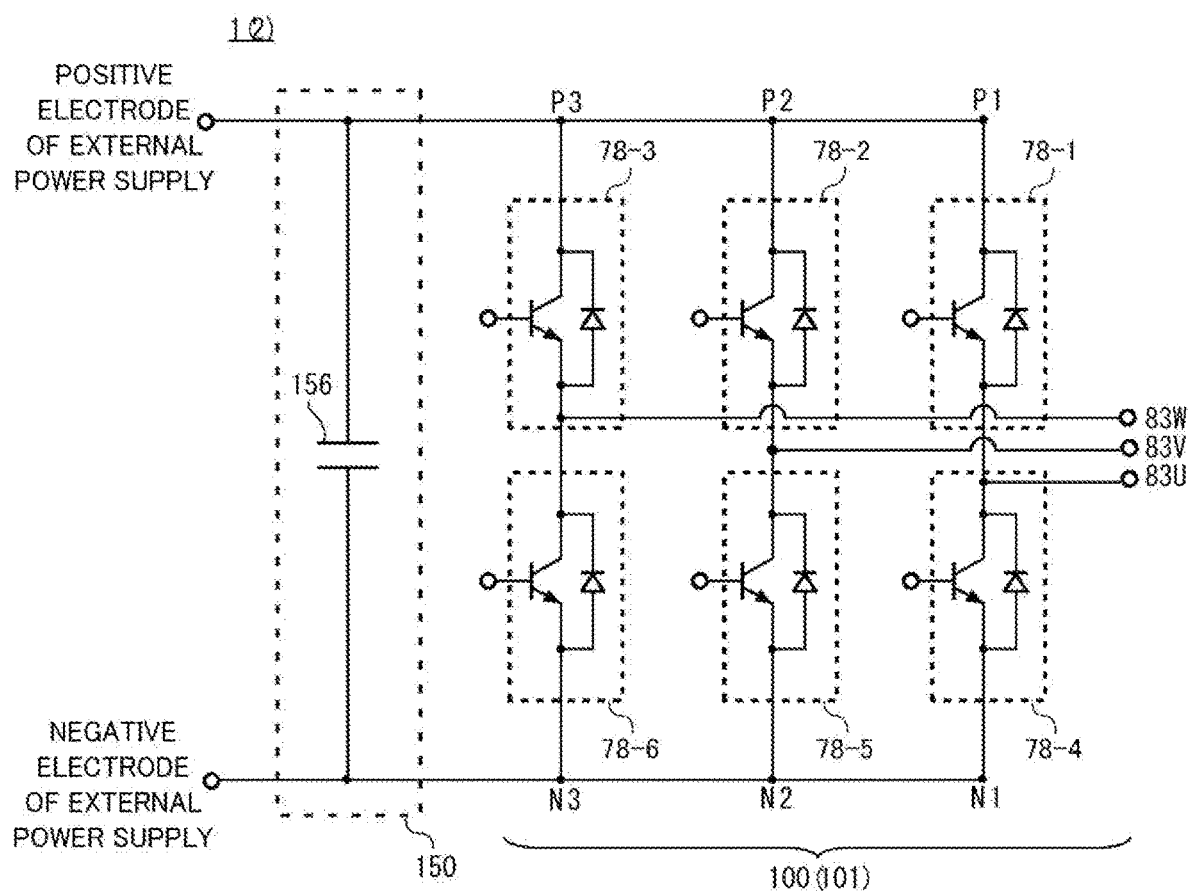
FIG. 13 is a main circuit diagram of an inverter 1 (2) according to a fourth embodiment of the present invention.

FIG. 13 is a main circuit diagram of the inverter 1 (2) according to a fourth embodiment of the present invention. As mentioned above, the semiconductor module 100 (101) of the inverter 1 (2) may be part of a vehicle-mounted unit that functions as a three-phase AC inverter circuit having the output terminal 83U, 83V, and 83W, and drives a motor of the vehicle.

In the semiconductor module 100 (101), the semiconductor chips 78-1, 78-2, and 78-3 may constitute an upper arm, and the semiconductor chips 78-4, 78-5, and 78-6 may constitute a lower arm. The pair of semiconductor chips 78-1, 78-4 may constitute a leg (U-phase). The pair of semiconductor chips 78-2, 78-5, and pair of semiconductor chips 78-3, 78-6 may also constitute legs (V-phase, W-phase) similarly. In the semiconductor chip 78-4, the emitter electrode, and collector electrode may be electrically connected to the input terminal N1 (N terminal 81), and output terminal 83U, respectively. In the semiconductor chip 78-1, the emitter electrode, and collector electrode may be electrically connected to the output terminal 83U, and input terminal P1 (P terminal 82), respectively. Similarly, in the semiconductor chips 78-5, 78-6, the emitter electrodes may be electrically connected to the input terminals N2 (N terminal 81), N3 (N terminal 81), respectively, and the collector electrodes may be electrically connected to the output terminals 83V, 83W, respectively. Furthermore, in the semiconductor chips 78-2, 78-3, the emitter electrodes may be electrically connected to the output terminals 83V, 83W, respectively, and the collector electrodes may be electrically connected to the input terminals P2 (P terminal 82), P3 (P terminal 82), respectively.

Each semiconductor chip 78-1 to 78-6 may be switched alternately by a signal input to a corresponding control terminal. In the present example, each semiconductor chip 78 may generate heat at the time of switching. The input terminals P1, P2, P3 may be connected to the positive electrode of an external power supply, the input terminals N1, N2, N3 may be connected to the negative electrode of the external power supply, and the output terminals 83U, 83V, 83W may be connected to a load. In addition, each semiconductor chip 78-1 to 78-6 may be connected in parallel with the internal capacitor 156 of the capacitor device 150. The input terminals P1, P2, P3 may be electrically connected to each other, and the other input terminals N1, N2, N3 may also be electrically connected to each other.

In the semiconductor module 100 (101), the plurality of semiconductor chips 78-1 to 78-6 may each be an RC-IGBT (Reverse Conducting IGBT) semiconductor chip. In addition, the semiconductor chips 78-1 to 78-6 may each include a combination of a transistor such as a MOSFET or an IGBT, and a diode.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS

1, 2: inverter; 10, 11: cooling device; 20: top plate; 22: top surface; 24: bottom surface; 26: shorter side; 28: longer side; 30: refrigerant flow channel; 32: inclined portion; 34: bottom portion; 36: side wall; 40: jacket; 42: opening portion; 44: end portion; 62: frame portion; 64: main-body portion; 70: semiconductor device; 70-1: U-phase unit; 70-2: V-phase unit; 70-3: W-phase unit; 71: straight line; 72: housing unit; 73: lead frame; 74: sealing portion; 75: circuit board; 76: circuit substrate; 76*a*: first end; 76*b*: second end; 77: metal body; 78: semiconductor chip; 79: through-hole; 81: N terminal; 82: P terminal; 83, 83U, 83V, 83W: output terminal; 90, 91: pipe; 92: refrigerant circulation portion; 94: cooling fin; 95: finned area; 95*a*: first boundary; 95*b*: second boundary; 96: middle position; 98: lower end; 100, 101: semiconductor module; 150: capacitor device; 151: housing; 153: terminal; 155: power supply terminal; 156: internal capacitor; 200: vehicle; 210: control device

What is claimed is:

1. A semiconductor module comprising:
   a semiconductor device, and
   a cooling device on which is mounted the semiconductor device, wherein the semiconductor device has:
   an input terminal;
   a wiring portion that includes a first end portion, and a second end portion, and extends in one direction, the first end portion being directly connected to the input terminal;
   a circuit substrate that includes a top surface, and a bottom surface, the top surface being provided with a first printed circuit board and a second printed circuit board along the one direction, the bottom surface being arranged in direct contact with a top surface of the cooling device, and the second printed circuit board being electrically separate from the first printed circuit board;
   a metal body electrically connected between the wiring portion, and a top surface of the first printed circuit board; and
   a semiconductor chip that includes a top surface electrode, and a bottom surface electrode, the top surface electrode being connected to the second end portion of the wiring portion, the bottom surface electrode being connected to a top surface of the second printed circuit board.

2. The semiconductor module according to claim 1, wherein the metal body is electrically connected to a central portion of the wiring portion, the central portion being closer to the input terminal than the semiconductor chip is.

3. The semiconductor module according to claim 1, wherein the first circuit board has an area larger than an area of contact with the metal body when seen in a plan view.

4. The semiconductor module according to claim 1, wherein
   the input terminal is an N terminal,
   the circuit substrate is further provided with a third circuit board,
   the semiconductor device further has:
   a P terminal;
   a second wiring portion that includes a third end portion, and a fourth end portion, and extends in the one direction, the third end portion being connected to the P terminal;
   a second metal body connected between the second wiring portion and a top surface of the third circuit board; and
   a second semiconductor chip that includes a top surface electrode, and a bottom surface electrode, the bottom surface electrode being connected to the top surface of the third circuit board.

5. The semiconductor module according to claim 4, wherein the second circuit board, and the third circuit board each have an L-shaped pattern including a longer portion and a shorter portion when seen in a plan view, the longer portions each extend in the one direction, the longer portion of the second circuit board, and the shorter portion of the third circuit board face each other, and are arranged with a gap therebetween, the gap extending in the one direction, the shorter portion of the second circuit board, and the longer portion of the third circuit board face each other, and are arranged with a gap therebetween, the gap extending in the one direction, and the semiconductor chip, and the second semiconductor chip are connected to the shorter portion of the second circuit board, and the shorter portion of the third circuit board, respectively, and overlap with each other only partially when seen in the one direction.

6. The semiconductor module according to claim 5, wherein the second metal body is positioned on the longer portion of the third circuit board, and is positioned closer to the P terminal than the second semiconductor chip is.

7. The semiconductor module according to claim 6, wherein when seen in the plan view, the second circuit board has an area larger than an area of contact with the semiconductor chip, and the third circuit board has an area larger than an area of contact with the second semiconductor chip and the second metal body.

8. The semiconductor module according to claim 7, wherein the metal body and the second metal body are each substantially a rectangular parallelepiped, and a bottom surface area of the metal body is smaller than a bottom surface area of the second metal body.

9. The semiconductor module according to claim 8, wherein a longer side of a bottom surface of the metal body is shorter than a longer side of a bottom surface of the second metal body, and the longer side of the bottom surface of the metal body is orthogonal to the one direction, and the longer side of the bottom surface of the second metal body is parallel to the one direction.

10. The semiconductor module according to claim 1, wherein the cooling device has:

a top plate including a front surface, and a back surface;

a refrigerant circulation portion arranged on the back surface of the top plate;

a cooling fin provided to extend from the back surface toward the refrigerant circulation portion;

an inlet that is for letting in a refrigerant, and communicates with the refrigerant circulation portion; and an outlet that is for letting out a refrigerant, and communicates with the refrigerant circulation portion, and when seen in a plan view, the metal body is arranged at a position corresponding to a finned area where the cooling fin is provided.

11. The semiconductor module according to claim 4, wherein the cooling device has:

a top plate including a front surface, and a back surface;

a refrigerant circulation portion arranged on the back surface of the top plate;

a cooling fin provided to extend from the back surface toward the refrigerant circulation portion;

an inlet that is for letting in a refrigerant, and communicates with the refrigerant circulation portion; and an outlet that is for letting out a refrigerant, and communicates with the refrigerant circulation portion, and when seen in a plan view, the metal body and the second metal body are arranged at a position corresponding to a finned area where the cooling fin is provided.

12. The semiconductor module according to claim 10, wherein, when seen in the plan view, the circuit substrate has a first end closer to the input terminal, and a second end opposite to the first end, the finned area has a first boundary closer to the input terminal, and a second boundary opposite to the first boundary, and a distance between the first end and the first boundary is longer than a distance between the second end and the second boundary.

13. A vehicle comprising the semiconductor module according to claim 1.

* * * * *